United States Patent [19]
Hirano et al.

[11] Patent Number: 6,081,036
[45] Date of Patent: *Jun. 27, 2000

[54] SEMICONDUCTOR DEVICE

[75] Inventors: Hiroshige Hirano; Toshiyuki Honda, both of Nara, Japan

[73] Assignee: Matsushita Electronics Corp., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/973,891

[22] PCT Filed: Apr. 18, 1997

[86] PCT No.: PCT/JP97/01346

§ 371 Date: Mar. 9, 1998

§ 102(e) Date: Mar. 9, 1998

[87] PCT Pub. No.: WO97/40528

PCT Pub. Date: Oct. 30, 1997

[30] Foreign Application Priority Data

Apr. 19, 1996 [JP] Japan ................................ 8-098266

[51] Int. Cl.[7] ........................ H01L 23/528; H01L 23/535
[52] U.S. Cl. .......................... 257/773; 257/390; 257/295; 257/305; 257/775; 257/767; 257/310
[58] Field of Search .................... 257/390, 295, 257/305, 758, 773, 775, 767, 310

[56] References Cited

U.S. PATENT DOCUMENTS

| | | | |
|---|---|---|---|
| 4,924,289 | 5/1990 | Matsuoka | 257/776 |
| 5,027,188 | 6/1991 | Owada et al. | 357/68 |
| 5,072,282 | 12/1991 | Takagi et al. | 257/775 |
| 5,400,275 | 3/1995 | Abe et al. | 365/145 |
| 5,406,123 | 4/1995 | Narayan | 257/767 |
| 5,523,625 | 6/1996 | Hayashi | 257/758 |
| 5,608,246 | 3/1997 | Yeager et al. | 257/298 |
| 5,712,510 | 1/1998 | Bui et al. | 257/767 |

FOREIGN PATENT DOCUMENTS

| | | |
|---|---|---|
| 61-93646 | 5/1986 | Japan . |
| 1-237524 | 9/1989 | Japan . |
| 4-78098 | 3/1992 | Japan . |
| 4-348054 | 12/1992 | Japan . |
| 5-90606 | 4/1993 | Japan . |
| 6-196478 | 7/1994 | Japan . |
| 7-201855 | 8/1995 | Japan . |

*Primary Examiner*—Leo P. Picard
*Assistant Examiner*—Hung Van Duong
*Attorney, Agent, or Firm*—Wall Marjama Bilinski & Burr

[57] ABSTRACT

A semiconductor device is provided wich includes a first wiring and second wirings in which end portions of the second wirings connected to the first wiring are bent parallel to that forms a predetermined angle with respect to the first direction. The first wiring extends along a first direction and has a wiring width direction in a second direction perpendicular to the first direction, where stresses are generated inside. The second wirings are situated above the first wiring, connected to the first wiring through a contact hole, and affected by the stresses of the first wiring.

29 Claims, 12 Drawing Sheets

SEMICONDUCTOR DEVICE

TECHNICAL FIELD

The present invention relates to a semiconductor device and, more particularly, to a construction for suppressing deterioration of performance and reliability due to thermal stresses that are generated in its composing material.

BACKGROUND ART

Conventionally, there is a semiconductor device which has a multilayer wiring structure. In such a semiconductor device, lower layer wirings and upper layer wirings are electrically connected through contact holes that are formed in an interlayer insulating film.

FIG. 13 is a diagram for explaining a wiring structure of such a semiconductor device. FIG. 13(a) is a plan view, and FIG. 13(b) is a cross-sectional view along a line XIIIb—XIIIb shown in FIG. 13(a). In the figure, reference numeral 250 designates a wiring structure that is formed on a silicon substrate 5. This wiring structure 250 has a lower layer wiring (first wiring) 1 that extends along a first direction D1 and has a wiring width direction in a second direction D2 perpendicular to the first direction D1, and upper layer wirings (second wirings) 2a and 2b that extend along the first direction D1 and are electrically connected to the lower layer wiring 1.

More specifically, the lower layer wiring 1 is formed on the silicon substrate 5 via an underlying insulating film 6, and the lower layer wiring 1 is covered with an interlayer insulating film 7. Further, the upper layer wirings (second wirings) 2a and 2b are formed on the interlayer insulating film 7. An end portion $2a_1$ of the upper layer wiring 2a is connected to an end portion 1a of the lower layer wiring 1 through a contact hole 7a that is formed in the interlayer insulating film 7. An end portion $2b_1$ of the upper layer wiring 2b is connected to the other end portion 1b of the lower layer wiring 1 through a contact hole 7b that is formed in the interlayer insulating film 7.

As a composing material of the upper layer wirings 2a and 2b, a metallic material of a low melting point, such as aluminum, which is relatively low-priced is used. As a composing material of the lower layer wiring 1, a metallic material of a high melting point, such as platinum and tungsten, is used, because various high temperature processing is usually performed after formation of the lower layer wiring.

By the way, as the conventional semiconductor devices having multilayer wiring structures described above, there have been developed various circuits from relatively small-sized integrated circuits mounting, for example, an amplifier circuit, an oscillating circuit, a power supply circuit and the like, to relatively large-sized integrated circuits, such as a microprocessor and a memory device. Especially in recent years, as a kind of non-volatile memory device, a ferroelectric memory device with ferroelectric capacitors as capacitors constituting memory cells has been contrived.

The ferroelectric capacitor consists of a pair of electrodes opposite to each other, and a dielectric layer comprising a ferroelectric material and sandwiched between both electrodes, and has the hysteresis characteristic as a relationship between a voltage applied between the both electrodes and polarizability of the ferroelectric material. That is, the ferroelectric capacitor has a construction in which even when the electric field (applied voltage) is zero, a remanence of a polarity in accordance with the hysteresis of voltage application remains in the ferroelectric layer. In the ferroelectric memory device non-volatility of the storage data is realized by representing storage data by the remanence of the ferroelectric capacitor.

FIGS. 14 and 15 are diagrams for explaining a conventional ferroelectric memory device. FIG. 14 is a plan view illustrating a memory cell array in the ferroelectric memory device. FIG. 15(a) is a cross-sectional view of a part along a line XVa—XVa shown in FIG. 14, FIG. 15(b) is a cross-sectional view of a part along a line XVb—XVb shown in FIG. 14, and FIG. 15(c) is a cross-sectional view of a part along a line XVc—XVc shown in FIG. 14.

In the figures, reference numeral 200 designates a memory cell array constituting a ferroelectric memory device. On a silicon substrate 201, a plurality of transistor regions 220a are arranged in a first direction D1, and an insulating film 202 for element isolation is formed on a portion of the silicon substrate 201, except the transistor regions 220a.

On both sides of the transistor regions 220a in a line along the first direction D1, lower electrodes (first electrodes) 211 are formed as cell plate electrodes on the insulating film 202 for element isolation via first interlayer insulating films 203. The lower electrode 211 comprises a metallic material of a high melting point, such as platinum, iridium, tungsten and titanium, and has a stripe-shaped plan configuration extending along the first direction D1. On surfaces of the lower electrodes 211, ferroelectric layers 213 are formed.

On the ferroelectric layers 213 on the surfaces of the lower electrodes 211, upper electrodes (second electrodes) 212 comprising a metallic material of a high melting point, such as platinum, iridium, tungsten and titanium, are formed corresponding to the respective transistor regions 220a. That is, on the ferroelectric layers 213, the plurality of upper electrodes 212 are arranged along the first direction D1. A plan shape of each upper electrode 212 is a rectangular shape having the first direction D1 as a longitudinal direction. In addition, as is known from FIG. 14, the area of each upper electrode 212 is smaller than that of the lower electrode 211. Here, the lower electrode 211, the upper electrodes 212, and the ferroelectric layer 213 located between these electrodes constitute ferroelectric capacitors 210. The surfaces of the ferroelectric layers 213 and the surfaces of the upper electrodes 211 are covered with second interlayer insulating films 204.

In this case, in order to reduce variations in the characteristics of the ferroelectric capacitors 210, i.e., variations in polarizability of the ferroelectric layers, and make changes in the characteristic, i.e., changes in polarizability with passage of time, less, the distances between the adjacent upper electrodes 212 and the areas of the upper electrodes 212 on the lower electrode 211 are set, considering thermal stresses generated in the lower electrode 211 and the like.

Between the pair of lower electrodes 211 that sandwich the transistor regions 220a opposing to each other, a pair of word lines (second wirings) 223a and 223b comprising polysilicon is disposed so as to straddle over the plurality of transistor regions 220a arranged in a line. A source diffusion region 222 and drain diffusion regions 221 of a memory transistor 220 constituting a memory cell are formed on both sides of the word lines 223a and 223b in each transistor region 220a. Portions of the word lines 223a and 223b located above each transistor region 220a constitute gate electrodes of the memory transistor 220, and are located on the substrate surface via gate insulating films 202a. The surfaces of the diffusion regions 221 and 222 and the word lines 223a and 223b are covered with the first and second interlayer insulating films 203 and 204. In FIG. 14, these interlayer insulating films are not shown.

The source diffusion region 222 located between the pair of word lines 223a and 223b in each transistor region 220a is connected to a bit line 233b extending along a second direction D2 perpendicular to the first direction D1, through a contact hole 205b formed in the first and second interlayer insulating films 203 and 204. The drain diffusion regions 221 located outside the opposite word lines 223a and 223b in each transistor region 220a are electrically connected to the upper electrodes 212 via connecting wirings 233a. That is, one end of the connecting wiring 233a is connected to the upper electrode 212 through a contact hole 204a formed in the second interlayer insulating film 204. The other end of the connecting wiring 233a is connected to the drain diffusion region 221 through a contact hole 205a formed in the first and second interlayer insulating films 203 and 204.

Both end portions 211a and 211b of the lower electrode 211 are connected to upper layer wirings 206a and 206b through contact holes 208a and 208b that are formed in the interlayer insulating films 203 and 204, respectively. The ferroelectric layer 213 formed on the surface of the lower electrode 211 is removed at portions of the lower electrode 211 that are connected to the upper layer wirings 206a and 206b.

The lower electrodes 211 and the ferroelectric layers 213 are formed by successively forming films of a metallic material, such as titanium and platinum, and a ferroelectric material on the interlayer insulating film 203 and patterning the films. The upper electrodes 212 are formed by forming a film of a metallic material, such as titanium and platinum, on the ferroelectric layer 213 and patterning this film. The bit lines 233b, the connecting wirings 233a, and the upper layer wirings 206a and 206b are formed by patterning a metallic film, such as aluminum, formed on the interlayer insulating film 204. The word lines 223a and 223b are formed by patterning a polysilicon film that is formed on the gate insulating films 202a and the insulating film 202 for element isolation.

The first interlayer insulating film 203 comprises an insulating material, such as NSG (oxide silicon based) and BPSG (boron, phosphine doped oxide silicon), and the second interlayer insulating film 204 comprises, for example, PSG (phosphine doped oxide silicon).

As the ferroelectric material composing the ferroelectric layer 213 of the ferroelectric capacitors, $KNO_3$, $PbLa_2O_3$—$ZrO_2$—$TiO_2$, $PbTiO_3$—$PbZrO_3$ or the like has been known. In addition, PCT International Publication WO 93/12542 also discloses a ferroelectric material that has extremely low fatigueness as compared with $PbTiO_3$—$PbZrO_3$, being suitable for a ferroelectric memory device.

Also in such a ferroelectric memory device, the wiring structure 250 shown in FIGS. 13(a) and 13(b) is employed in peripheral circuits, except a memory cell array. When the lower layer wiring 1 of the wiring structure 250 comprises the same composing material as the lower electrode 211 of the memory cell array 200 described above, for example, platinum, seeing from the viewpoint of simplification of wafer processes, as shown in FIG. 13(c), it is more advantageous that a ferroelectric material layer 3 which is to be a dielectric layer of the ferroelectric capacitor remains on a region of the surface of the lower layer wiring 1, except portions connected to the upper layer wirings 2a and 2b.

The operation will be described briefly.

In the ferroelectric memory device with the construction as described above, when, for example, the word line 223a is selected and subsequently, one of the lower electrodes 211 (for example, the uppermost lower electrode shown in FIG. 14) is driven, thereby making the voltage level thereof the level corresponding to the logical voltage "H", storage data of the ferroelectric capacitors 210 formed on this lower electrode are read out onto the respective bit lines 233b through the connecting wirings 233a and the transistors 220. The storage data read out onto the respective bit lines 233b are amplified by sense amplifiers (not shown) to be output to the outside of the ferroelectric memory device. Thereafter, the voltage level of the lower electrode 211 is made a level corresponding to the logical voltage "L" to make the word line 223a the unselected state, thereby completing the reading out.

However, in such a device in which the lower layer wiring 1 in the multilayer wiring structure comprises a conductive material having a larger thermal expansion coefficient, such as platinum, as the conventional semiconductor device shown in FIG. 13, the lower layer wiring 1 that is formed by high temperature processing contracts at normal temperature. Therefore, great tensile force is applied to the upper layer wirings 2a and 2b connected to this wiring. Especially when the plan shape of the lower layer wiring 1 is a slender shape, the thermal stresses of the lower layer wiring 1 that are applied to the portions connected to the upper layer wirings 2a and 2b become extremely large, so that there may be produced breaking of the connection portions of the lower layer wiring 1 and the upper layer wirings 2a and 2b, and the upper layer wirings 2a and 2b may break. As described above, there is a problem in that the thermal stresses generated in the lower layer wiring 1 become obstacles to high reliability of the semiconductor device.

Also in the conventional ferroelectric memory device with ferroelectric capacitors shown in FIGS. 14 and 15, since the lower electrode 211 as a cell plate electrode has a stripe-shaped plan, the thermal stresses of the lower electrode 211 that are applied to the portions connected to the upper layer wirings 206a and 206b become extremely large, so that there may be produced breaking of the connection portions of the lower electrode 211 and the upper layer wirings 206a and 206b, and the upper layer wirings 206a and 206b may break. Further, in addition to the deterioration of reliability due to the breaking as described above, the thermal stresses of the lower electrode 211 affect the ferroelectric layer 213 thereon, thereby causing variations in the characteristics and deterioration of the characteristics of the ferroelectric capacitors. As a result, there is another problem in that the performance and reliability of the ferroelectric memory device are deteriorated.

The present invention is directed to solving the above-described conventional problems, and has an object to provide a semiconductor device in which the influences by stresses generated in a wiring or an electrode can be reduced, thereby suppressing breaking at wirings and an electrode, and variations in characteristics and characteristic deterioration of ferroelectric capacitors that are disposed on the electrode.

DISCLOSURE OF THE INVENTION

In order to achieve the object, a semiconductor device of claim 1 includes a first wiring extending along a first direction and having a wiring width direction in a second direction perpendicular to the first direction, where stresses are generated inside, and second wirings electrically connected to the first wiring and affected by the stresses of the first wiring, wherein end portions of the second wirings connected to the first wiring are bent parallel to a direction that forms a predetermined angle with respect to the first direction.

A semiconductor device of claim 2 is the semiconductor device as defined in claim 1 wherein the end portions of the second wirings connected to the first wiring are bent parallel to the second direction perpendicular to the first direction.

A semiconductor device of claim 3 includes a first wiring extending along a first direction and having a wiring width direction in a second direction perpendicular to the first direction, where stresses are generated inside, and second wirings electrically connected to end portions of the first wiring and affected by the stresses of the first wiring, wherein end portions of the second wirings connected to the first wiring are disposed to extend along the first wiring and toward the inside of the first wiring.

A semiconductor device of claim 4 includes a first wiring where stresses are generated inside, and second wirings electrically connected to the first wiring and affected by the stresses of the first wiring, wherein the first wiring has a bent portion formed at its portion.

A semiconductor device of claim 5 is the semiconductor device as defined in claim 4 wherein a body of the first wiring, except end portions connected to the second wirings, is bent at a plurality of positions to have a zigzag plan shape.

A semiconductor device of claim 6 is the semiconductor device as defined in claim 5 wherein the first wiring body comprises only oblique wiring parts parallel to directions, except a direction perpendicular to a first direction, or only the oblique wiring parts and wiring parts parallel to the first direction.

A semiconductor device of claim 7 includes a first wiring extending along a first direction and having a wiring width direction in a second direction perpendicular to the first direction, where stresses are generated inside, and second wirings electrically connected to the first wiring and affected by the stresses of the first wiring, wherein the whole of the first wiring is divided into a plurality of wiring parts, and the respective wiring parts of the first wiring are electrically connected to form a predetermined current path extending from one end of the first wiring to the other end.

A semiconductor device of claim 8 includes a first wiring extending along a first direction and having a wiring width direction in a second direction perpendicular to the first direction, where stresses are generated inside, and second wirings electrically connected to the first wiring and affected by the stresses of the first wiring, wherein the first wiring has narrow wiring width portions with narrower wiring widths than those of the other portions, the narrow portions being formed by chipping portions of a first wiring body, except end portions that are connected to the second wirings.

A semiconductor device of claim 9 is the semiconductor device as defined in claim 8 wherein the narrow wiring width portions are formed by chipping the first wiring body from the both sides at predetermined positions in the wiring path.

A semiconductor device of claim 10 is the semiconductor device as defined in claim 9 wherein sides of the narrow wiring width portions are parallel to directions, except a direction perpendicular to the first direction.

A semiconductor device of claim 11 is the semiconductor device as defined in claim 8 wherein the first wiring body has at least a first narrow wiring width portion that is formed by chipping the body from one side, and at least a second narrow wiring width portion that is formed by chipping the body from the other side.

A semiconductor device of claim 12 is the semiconductor device as defined in claim 11 wherein the wiring widths of the first and second narrow wiring width portions are smaller than ½ of those of the portions of the first wiring body, except the narrow wiring width portions, and the current path along the center line of the first wiring is divided by the chipped parts at the first and second narrow wiring width portions.

A semiconductor device of claim 13 is the semiconductor device as defined in claim 11 wherein sides of the first and second narrow wiring width portions at the chipped part sides are parallel to directions, except a direction perpendicular to the first direction.

A semiconductor device of claim 14 includes a first wiring extending along a first direction and having a wiring width direction in a second direction perpendicular to the first direction, where stresses are generated inside, and second wirings electrically connected to the first wiring and affected by the stresses of the first wiring, wherein the first wiring has through openings formed in a first wiring body, except end portions connected to the second wirings.

A semiconductor device of claim 15 is the semiconductor device as defined in claim 14 wherein the plan shapes of the through openings are made a rectangular shape in which the length in the first direction is smaller than the length in the second direction perpendicular to the first direction.

A semiconductor device of claim 16 is the semiconductor device as defined in any of claims 1 to 15 wherein the first wiring comprises platinum, iridium, titanium, or tungsten, and an insulating layer comprising a ferroelectric material is formed on the surface of the first wiring.

A semiconductor device of claim 17 constitutes a ferroelectric memory device with a plurality of memory cells comprising transistors and ferroelectric capacitors, wherein the ferroelectric capacitor comprises a first electrode where stresses are generated inside, a second electrode positioned opposite to this first electrode, and a ferroelectric layer positioned between the first and second electrodes, the first electrode having a bent portion formed at its portion.

A semiconductor device of claim 18 constituting a ferroelectric memory device with a plurality of memory cells comprising transistors and ferroelectric capacitors, wherein the ferroelectric capacitor comprises a first electrode that extends along a first direction, where stresses are generated inside, a second electrode positioned opposite to this first electrode, and a ferroelectric layer positioned between the first and second electrodes, the whole of the first electrode being divided into a plurality of electrode parts, and the respective electrode parts being electrically connected to form a predetermined current path extending from one end of the first electrode to the other end.

A semiconductor device of claim 19 is the semiconductor device as defined in claim 17 wherein a body of the first electrode, except both end portions, is bent at a plurality of positions to have a zigzag plan shape.

A semiconductor device of claim 20 comprising as defined in claim 19 has first and second memory cell groups each comprising a plurality of memory cells, first and second bit line groups corresponding to the first and second memory cell groups, first and second word line groups provided corresponding to the first and second memory cell groups, and comprising a plurality of word lines for controlling ON and OFF of transistors constituting the memory cells of the corresponding memory cell groups, and sense amplifiers connected to the respective bit lines of the first and second bit line groups, for sensing storage data on the bit lines. The first electrode of the ferroelectric capacitor constituting each memory cell is connected to a cell plate line for applying a predetermined driving voltage to the electrode. The second electrode of the ferroelectric capacitor constituting each memory cell of the first memory cell group is connected to the corresponding bit line of the first bit line group through the transistor of the first memory cell group. The second electrode of the ferroelectric capacitor constituting each memory cell of the second memory cell group is connected to the corresponding bit line of the second bit line group through the transistor of the second memory cell group. The word line of the first word line group and the word line of the second word line group are simultaneously selected so that complementary data is read out onto the corresponding bit lines of both of the bit line groups.

BEST EMBODIMENTS FOR CARRYING OUT THE INVENTION

Embodiment 1

Figure 1:
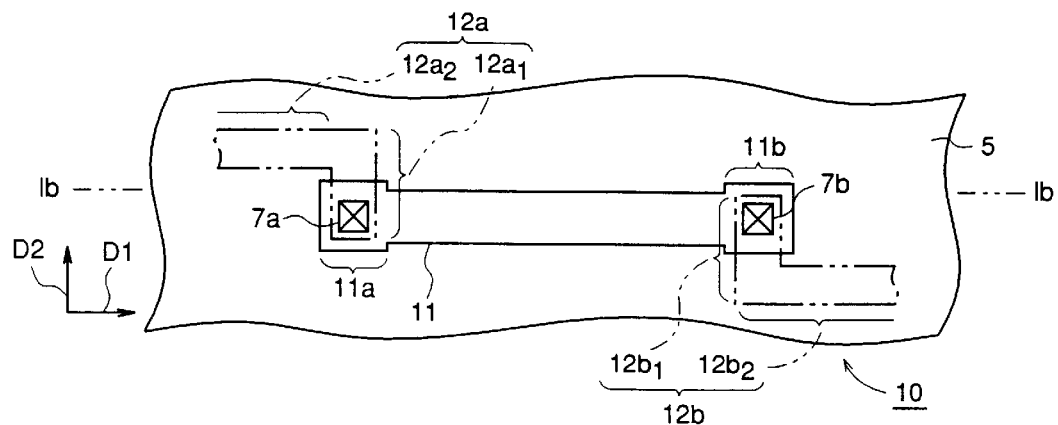
FIG. 1(a) is a plan view illustrating a wiring structure of a semiconductor device in accordance with a first embodiment of the present invention.
FIG. 1(b) is its cross-sectional view.
Figure 1:
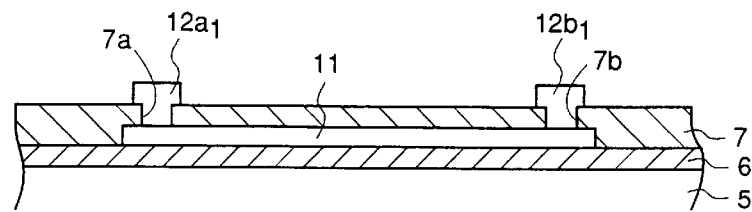

FIG. 1 is a diagram for explaining a semiconductor device according to a first embodiment of the present invention. FIG. 1(a) is a plan view illustrating a wiring structure of the semiconductor device, and FIG. 1(b) is a cross-sectional view along a line Ib—Ib shown in FIG. 1(a).

In the figure, reference numeral 10 designates a wiring structure of a semiconductor device according to the first embodiment of the invention. This wiring structure 10 has a lower layer wiring (first wiring) 11 that extends along a first direction D1 and has a wiring width direction in a second direction perpendicular to the first direction D1, where tensile stresses (thermal stresses) are generated inside, and upper layer wirings (second wirings) 12a and 12b that are electrically connected to the lower layer wiring 11 and are affected by the thermal stresses of the lower layer wiring 11.

In this case, the lower layer wiring 11 is formed by patterning a platinum layer that is formed on a silicon substrate 5 via an underlying insulating film 6. The upper layer wirings 12a and 12b are formed by patterning an aluminum layer that is formed on the platinum layer via an interlayer insulating film 7. The upper layer wirings 12a and 12b have structures in which their end portions $12a_1$ and $12b_2$ are bent perpendicularly to bodies $12a_2$ and $12b_2$, except the end portions, respectively. The bodies $12a_2$ and $12b_2$ are located parallel to the lower layer wiring 11 extending along the first direction D1, and the bent end portions $12a_1$ and $12b_1$ are located parallel to the second direction D2 perpendicular to the first direction D1.

The end portion $12a_1$ of the upper layer wiring 12a is located on an end portion 11a of the lower layer wiring 11, and connected to the end portion 11a of the lower layer wiring 11 through a contact hole 7a that is formed in the interlayer insulating film 7. The end portion $12b_1$ of the upper layer wiring 12b is located on the other end portion 11b of the lower layer wiring 11, and connected to the other end portion 11b of the lower layer wiring 11 through a contact hole 7b that is formed in the interlayer insulating film 7. In FIG. 1(a), the underlying insulating film 6 and the interlayer insulating film 7 are not shown.

In the first embodiment with such a construction, the end portions $12a_1$ and $12b_1$ of the upper layer wirings $12a$ and $12b$ that are connected to the lower layer wiring 11 are bent parallel to the second direction D2 perpendicular to the first direction D1 along which the lower layer wiring 11 extends. Therefore, the end portions $12a_1$ and $12b_1$ of the second wirings are transformed by the tensile stresses in the first direction D1 being generated in the lower layer wiring 11, thereby reducing the stresses. Consequently, breaking of connection portions of the lower layer wiring 11 and the upper layer wirings $12a$ and $12b$ and portions of the upper layer wirings $12a$ and $12b$ due to the thermal stresses can be suppressed, resulting in improved reliability of the semiconductor device.

In the first embodiment of the invention, the lower layer wiring 11 formed by patterning the platinum layer that is formed on the insulating film on the substrate surface is described. However, when a portion of the lower layer wiring 11 constitutes a lower electrode of a ferroelectric capacitor or the like, the lower layer wiring 11 may be formed by patterning a platinum layer and a ferroelectric layer that are successively formed on the insulating film on the substrate surface. That is, the lower layer wiring 11 may have a structure in which the ferroelectric layer is formed on the surface of the platinum layer constituting the lower layer wiring, except on the connection portions of the upper layer wirings $12a$ and $12b$.

In addition, in the first embodiment of the invention, as a multilayer wiring structure of the semiconductor device, the wiring structure 10 shown in FIG. 1 is described. However, the semiconductor device according to the first embodiment may have the conventional wiring structure 250 shown in FIG. 12, in addition to the wiring structure 10. For example, also in the semiconductor device of the first embodiment, when the influences by the thermal stresses of the lower layer wiring on other wirings connected to the lower layer wiring are small, for example, the lower layer wiring is short, the conventional wiring structure 250 can be employed as a multilayer wiring structure.

Embodiment 2

Figure 2:
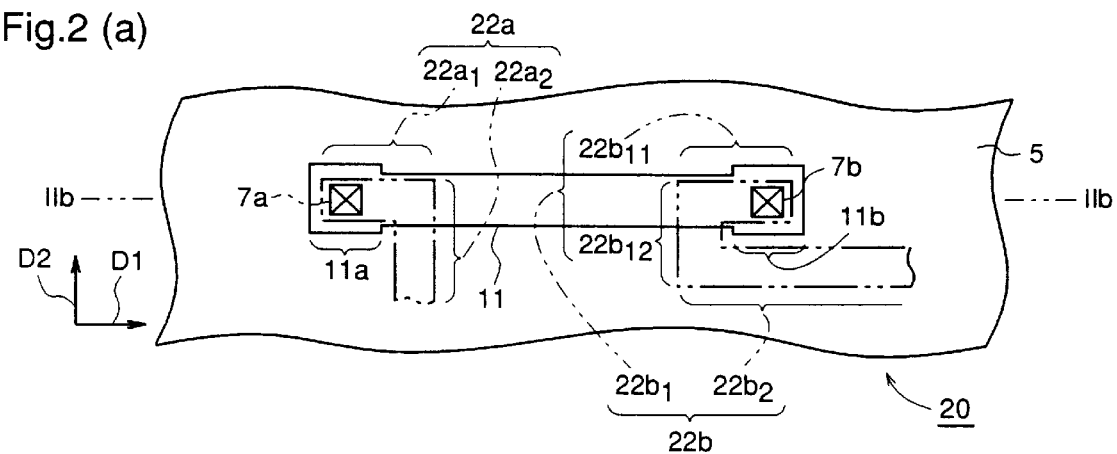
FIG. 2(a) is a plan view illustrating a wiring structure of a semiconductor device in accordance with a second embodiment of the present invention.
FIG. 2(b) is its cross-sectional view.
Figure 2:
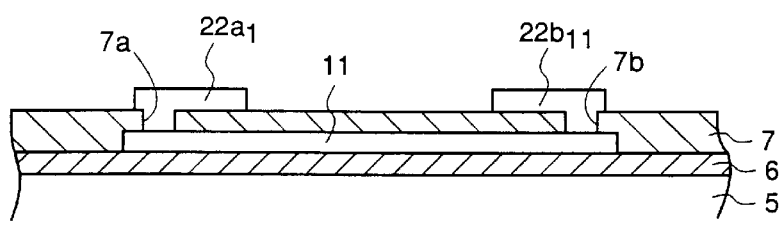

FIG. 2 is a diagram for explaining a semiconductor device according to a second embodiment of the present invention. FIG. 2(a) is a plan view illustrating a wiring structure of the semiconductor device, and FIG. 2(b) is a cross-sectional view along a line IIb—IIb shown in FIG. 2(a).

In the figure, reference numeral 20 designates a wiring structure of a semiconductor device according to the second embodiment of the invention. As in the first embodiment of the invention, this wiring structure 20 has a lower layer wiring (first wiring) 11 that extends along a first direction D1, where tensile stresses (thermal stresses) are generated inside, and upper layer wirings (second wirings) $22a$ and $22b$ that are electrically connected to the lower layer wiring 11 and are affected by the thermal stresses of the lower layer wiring 11.

In this case, the upper layer wirings $22a$ and $22b$ are formed by patterning an aluminum layer that is formed on a platinum layer constituting the lower layer wiring 11 via an interlayer insulating film 7. Further, the upper layer wiring $22a$ has a structure in which its end portion $22a_1$ is bent perpendicularly to a body $22a_2$, except the end portion. The body $22a_2$ is located parallel to a second direction D2 perpendicular to the first direction D1, and the bent end portion $22a_1$ extends parallel to the first direction D1 and toward the inside of the lower layer wiring 11. This end portion $22a_1$ is located on an end portion $11a$ of the lower layer wiring 11, and connected to the end portion $11a$ of the lower layer wiring 11 through a contact hole $7a$ that is formed in the interlayer insulating film 7.

The upper layer wiring $22b$ has a structure in which its end portion $22b_1$ is bent against a body $22b_2$, except the end portion. The body $22b_2$ is located parallel to the first direction D1. The bent end portion $22b_1$ comprises a tip portion $22b_{11}$ parallel to the first direction D1 and a portion $22b_{12}$ parallel to the second direction D2 perpendicular to the first direction D1. The portion $22b_{11}$ is located on the other end portion $11b$ of the lower layer wiring 11, and connected to the other end portion $11b$ of the lower layer wiring 11 through a contact hole $7b$ that is formed in the interlayer insulating film 7. In FIG. 2(a), the underlying insulating film 6 and the interlayer insulating film 7 are not shown.

In the second embodiment with such a construction, the end portion $22a_1$ and the tip portion $22b_{11}$ of the upper layer wirings $22a$ and $22b$ that are connected to the lower layer wiring 11 are disposed along the lower layer wiring 11 and toward the inside of the lower layer wiring. Therefore, the body $22a_2$ adjoining the end portion $22a_1$ in the upper layer wiring $22a$, and the portion $22b_{12}$ adjoining the tip portion $22b_{11}$ in the upper layer wiring $22b$ form predetermined angles with respect to the first direction D1 along which the lower layer wiring 11 extends. Consequently, the body $22a_2$ of the upper layer wiring $22a$ and the portion $22b_{12}$ of the upper layer wiring $22b$ are transformed by the tensile stresses in the first direction D1 being generated in the lower layer wiring 11, thereby reducing the stresses. As a result, breaking of connection portions of the lower layer wiring 11 and the upper layer wirings $22a$ and $22b$ and the like due to the stresses can be suppressed, leading to improved reliability of the semiconductor device.

In the second embodiment of the invention, as a multilayer wiring structure of the semiconductor device, the wiring structure 20 shown in FIG. 2 is described. However, the semiconductor device according to the second embodiment may have required one of the wiring structure 10 shown in FIG. 1 and the conventional wiring structure 250 shown in FIG. 12, in addition to the wiring structure 20.

In addition, in the first and second embodiments of the invention, although the thermal stresses generated in the lower layer wiring 11 are reduced by the upper layer wirings connected to the lower layer wiring, the thermal stresses generated in the lower layer wiring may be reduced at the inside of the wiring. A wiring structure with such a construction will be described for a third embodiment.

Embodiment 3

Figure 3:
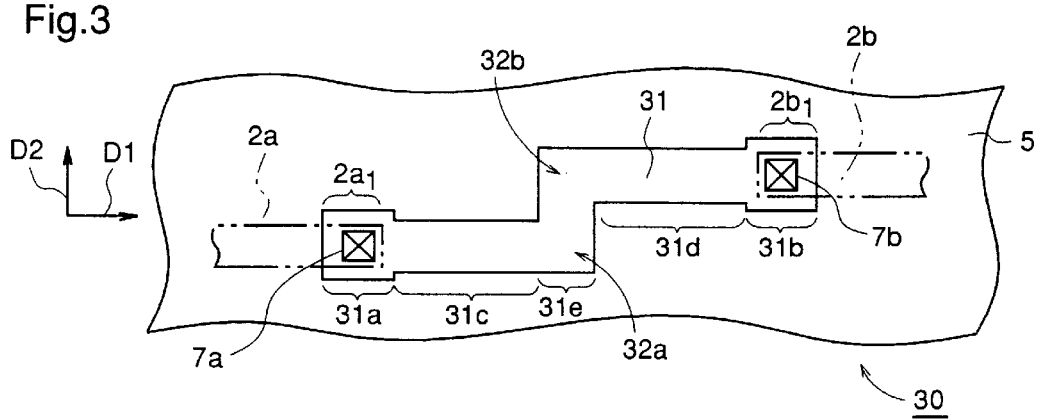
FIG. 3 is a plan view illustrating a wiring structure of a semiconductor device in accordance with a third embodiment of the present invention.

FIG. 3 is a plan view for explaining a semiconductor device according to a third embodiment of the present invention, which illustrates a wiring structure of the semiconductor device.

In the figure, reference numeral 30 designates a wiring structure of a semiconductor device according to the third embodiment of the invention, and its cross-sectional structure is identical to the wiring structure 250 of the conventional semiconductor device. This wiring structure 30 has a lower layer wiring (first wiring) 31 where tensile stresses (thermal stresses) are generated inside, and upper layer wirings (second wirings) $2a$ and $2b$ that are electrically connected to the lower layer wiring 31 and are affected by the thermal stresses of the lower layer wiring 31.

In this case, the lower layer wiring 31 is formed by patterning a platinum layer that is formed on a silicon substrate 5 via an insulating film. An end portion $31a$ of the lower layer wiring is connected to an end portion $2a_1$ of the upper layer wiring 2a through a contact hole 7a that is formed in an interlayer insulating film, and the other end portion 31b is connected to an end portion $2b_1$ of the upper layer wiring 2b through a contact hole 7b that is formed in the interlayer insulating film.

Further, the lower layer wiring 31 has two bent portions 32a and 32b in the center of the position between the contact holes 7a and 7b. More specifically, the lower layer wiring 31 comprises a first lateral side portion 31c that extends from the end portion 31a to the center of the wiring along the first direction D1, a second lateral side portion 31d that extends from the other end portion 31b to the center of the wiring along the first direction D1, and is parallel to the first lateral side portion 31c, and a longitudinal side portion 31e that is located in the center of the lower layer wiring 31, adjoins the lateral side portions 31c and 31d, and is parallel to a second direction D2 perpendicular to the first direction D1. A connection portion of the longitudinal side portion 31e and the first lateral side portion 31c, and a connection portion of the longitudinal side portion 31e and the second lateral side portion 31d are the bent portions 32a and 32b, respectively. The other construction is identical to the conventional wiring structure 250.

In the third embodiment of the invention with such a construction, the lower layer wiring 31 in which the tensile stresses are generated has the two bent portions 32a and 32b in the center. Therefore, the bent portions are transformed by the tensile stresses being generated in the longitudinal direction D1 of the lower layer wiring 31, thereby reducing the tensile stresses. As a result, breaking of connection portions of the lower layer wiring 31 and the upper layer wirings 2a and 2b, portions of the upper layer wirings and the like due to the stresses can be suppressed, leading to improved reliability of the semiconductor device.

In addition, in the third embodiment of the invention, as a multilayer wiring structure of the semiconductor device, the wiring structure 30 shown in FIG. 3 is described. However, the semiconductor device according to the third embodiment may have required one of the wiring structure 10 shown in FIG. 1, the wiring structure 20 shown in FIG. 2, and the conventional wiring structure 250 shown in FIG. 12, in addition to the wiring structure 30.

Embodiment 4

Figure 4:
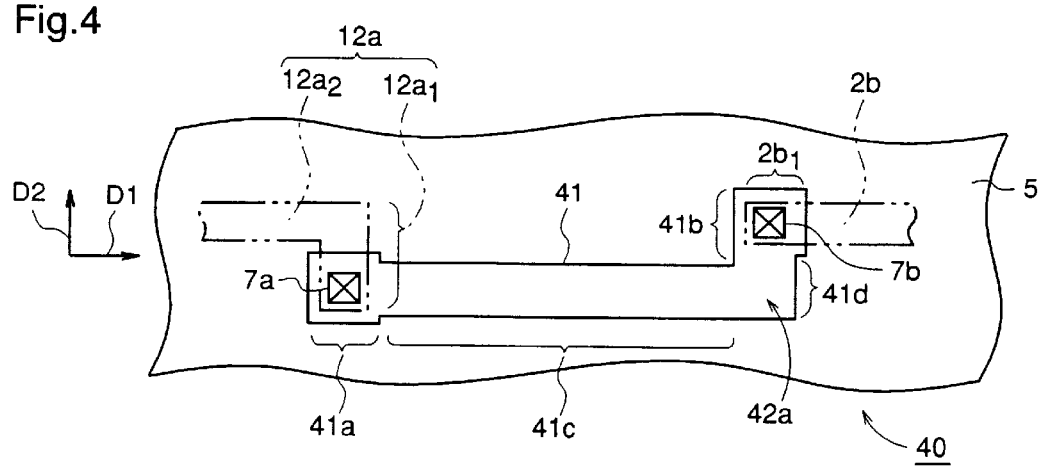
FIG. 4 is a plan view illustrating a wiring structure of a semiconductor device in accordance with a fourth embodiment of the present invention.

FIG. 4 is a plan view for explaining a semiconductor device according to a fourth embodiment of the present invention, which illustrates a wiring structure of the semiconductor device.

In the wiring structure according to the fourth embodiment, tensile stresses generated in a lower layer wiring (first wiring) are reduced at a bent portion of the lower layer wiring, and the influences by the stresses on the upper layer wiring are reduced by means of the direction of leading an upper layer wiring (second wiring) to which the tensile stresses (thermal stresses) are applied. In principle, this wiring structure is obtained by combining the wiring structure 10 of the first embodiment and the wiring structure 20 of the second embodiment.

A brief description is given using FIG. 4. In the figure, reference numeral 40 designates a wiring structure of a semiconductor device according to the fourth embodiment of the invention. The same reference numerals as those shown in FIGS. 1 and 3 designate the same parts in the first and third embodiments.

This wiring structure 40 has a lower layer wiring (first wiring) 41 where tensile stresses (thermal stresses) are generated, and upper layer wirings (second wirings) 12a and 2b that are electrically connected to the lower layer wiring 41 and are affected by the thermal stresses of the lower layer wiring 41. In this case, the lower layer wiring 41 is formed by patterning a platinum layer that is formed on a silicon substrate 5 via an insulating film. The upper layer wirings 12a and 2b are formed by patterning an aluminum layer that is formed on the platinum layer via an interlayer insulating film. The upper layer wiring 12a has a structure in which its end portion $12a_1$ is bent perpendicularly to a body $12a_2$, except the end portion.

The end portion $12a_1$ of the upper layer wiring 12a is located on an end portion 41a of the lower layer wiring 41, and connected to the end portion 41a of the lower layer wiring 41 through a contact hole 7a that is formed in the interlayer insulating film. An end portion $2b_1$ of the upper layer wiring 2b is located on the other end portion 41b of the lower layer wiring 41, and connected to the end portion 41b of the lower layer wiring 41 through a contact hole 7b that is formed in the interlayer insulating film.

Further, the lower layer wiring 41 has a bent portion 42a in a region at the vicinity of the both contact hole 7b. More specifically, the lower layer wiring 41 comprises a lateral side portion 41c that extends from the end portion 41a to the vicinity of the other end portion 41b along the first direction D1, and a longitudinal side portion 41d that extends from the other end portion 41b along a second direction D2 perpendicular to the first direction D1, and adjoins the lateral side portion 41c. A connection portion of the longitudinal side portion 41d and the lateral side portion 41c is the bent portion 42a.

In the fourth embodiment with such a construction, the tensile stresses that are applied to the upper layer wiring 12a are reduced by the transformation of the bent portion $12a_1$ of the wiring 12a, and the tensile stresses that are applied to the upper layer wiring 2b are reduced by the transformation of the bent portion 42a of the lower layer wiring 41. As a result, as in the respective embodiments, breaking of connection portions of the lower layer wiring 41 and the upper layer wirings 12a and 2b, portions of the upper layer wirings and the like due to the tensile stresses being generated in the lower layer wiring 41 can be suppressed, leading to improved reliability of the semiconductor device.

In the fourth embodiment of the invention, although the lower layer wiring 41 has one bent portion, the lower layer wiring may have bent portions at two positions.

In addition, in the fourth embodiment of the invention, there is described the structure that is obtained by combining the structure of the upper layer wiring according to the first embodiment and the structure of the lower layer wiring according to the third embodiment. However, a wiring structure in which stresses of a lower layer wiring are reduced may be realized by combining the structure of the lower layer wiring according to the first embodiment and the structure of the upper layer wiring according to the second embodiment.

Further, in the fourth embodiment of the invention, as a multilayer wiring structure of the semiconductor device, the wiring structure 40 shown in FIG. 4 is described. However, the semiconductor device according to the fourth embodiment may have required one of the wiring structure 10 shown in FIG. 1, the wiring structure 20 shown in FIG. 2, the wiring structure 30 shown in FIG. 3, and the conventional wiring structure 250 shown in FIG. 12, in addition to the wiring structure 40.

Embodiment 5

Figure 5:
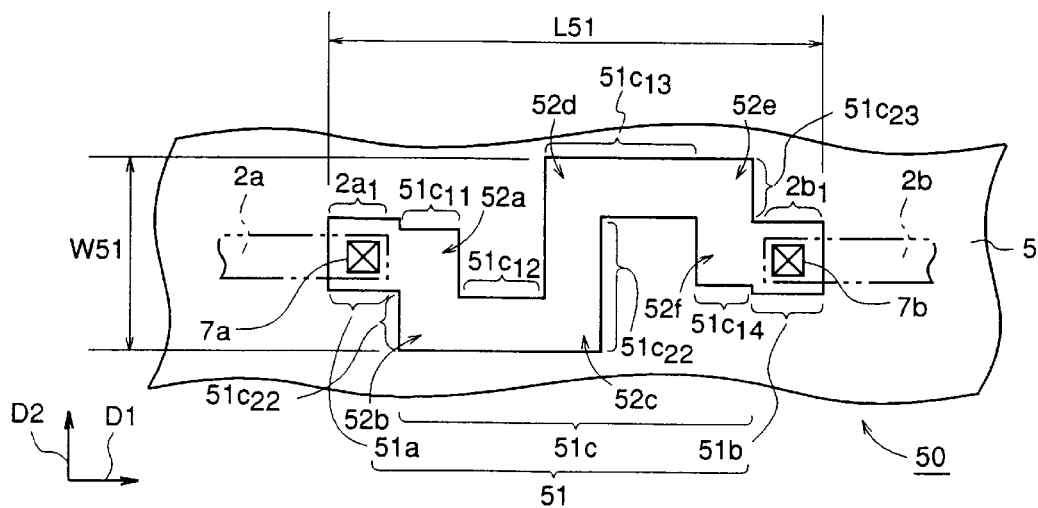
FIG. 5(a) is a plan view illustrating a wiring structure of a semiconductor device in accordance with a fifth embodiment of the present invention.
FIG. 5(b) is a plan view illustrating a wiring structure of a semiconductor device in accordance with a modification example of the fifth embodiment.
Figure 5:
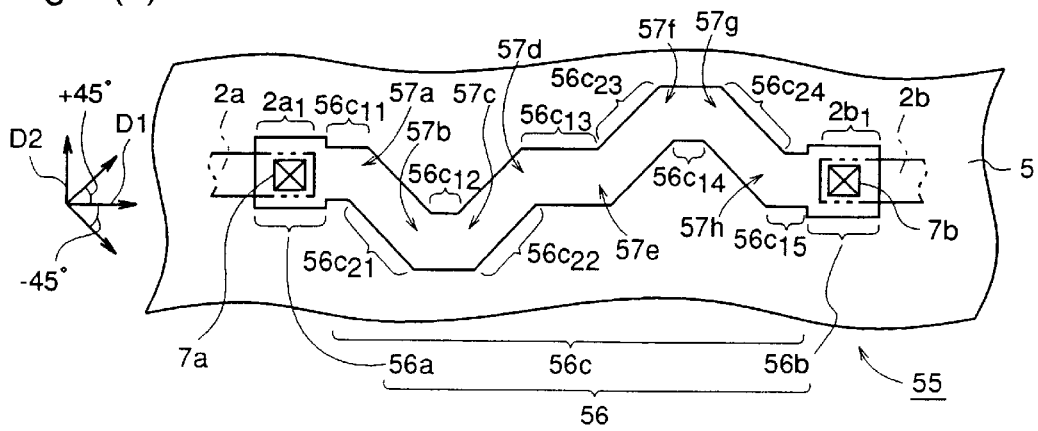

FIG. 5 is a plan view for explaining a semiconductor device according to a fifth embodiment of the present invention, each of which illustrates a wiring structure of the semiconductor device.

This wiring structure shown in FIG. 5 is obtained by developing the wiring structure 30 of the third embodiment, and has a structure in which the lower layer wiring 31 has bent portions at six positions, thereby reducing tensile stresses generated in a lower layer wiring more effectively. In addition, in the lower layer wiring with such a construction, when the distance between contact holes 7a and 7b in the first direction D1 is constant, the wiring is longer than the lower layer wirings in the respective embodiments.

A brief description is given using FIG. 5. In the figure, reference numeral 50 designates a wiring structure of a semiconductor device according to the fifth embodiment of the invention, and its cross-sectional structure is identical to the wiring structure 250 of the conventional semiconductor device.

This wiring structure 50 has a lower layer wiring (first wiring) 51 where tensile stresses are generated inside, and upper layer wirings (second wirings) 2a and 2b that are electrically connected to the lower layer wiring 51 and are affected by the thermal stresses of the lower layer wiring 51. An end portion $2a_1$ of the upper layer wiring 2a is located on an end portion 51a of the lower layer wiring 51, and connected to the end portion 51a of the lower layer wiring 51 through a contact hole 7a that is formed in an interlayer insulating film, and an end portion $2b_1$ of the upper layer wiring 2b is located on the other end portion 51b of the lower layer wiring 51, and connected to the other end portion 51b of the lower layer wiring 51 through a contact hole 7b that is formed in the interlayer insulating film.

In this case, the lower layer wiring 51 is formed by patterning a platinum layer that is formed on a silicon substrate 5 via an insulating film, and has six bent portions 52a~52f in a region between the contact holes 7a and 7b. More specifically, a body 51c of the lower layer wiring 51, except the both end portions 51a and 51b, comprises first to fourth lateral side portions $51c_{11}$~$51c_{14}$ parallel to the first direction D1, and first to third longitudinal side portions $51c_{21}$~$51c_{23}$ parallel to a second direction D2 perpendicular to the first direction D1, and has a structure in which the lateral side portions and the longitudinal side portions are alternately connected. Connection portions of the adjacent lateral side portions and longitudinal side portions are the bent portions 52a~52f, respectively. As a result, the lower layer wiring 51 has a zigzag-shaped plan as a whole.

The ratio of the length $L_{51}$ of the lower layer wiring 51 between the contact holes 7a and 7b to the swinging width $W_{51}$ of the zigzag shape ($L_{51}/W_{51}$) is 2. This is because it has been ascertained from the results of experiments that the effect of reducing stresses is remarkable under the condition that the ratio ($L_{51}/W_{51}$) satisfies a relationship of $L_{51}/W_{51} \leq 10$.

In the fifth embodiment with such a construction, the lower layer wiring 51 has more bent portions 52a~52f than those of the lower layer wiring 31 of the third embodiment. Therefore, the tensile stresses in the lateral direction of the lower layer wiring are reduced by the transformation of the six bent portions. As a result, as compared with the third embodiment, the reduction in stresses can be realized more satisfactory.

In addition, it is possible to combine the structure of the zigzag lower layer wiring 51 and the structure of the upper layer wirings according to the first or second embodiment. In this case, production of the breaking of the upper layer wirings due to the tensile stresses and the like can be suppressed more effectively.

Further, the zigzag shape of the body 51c of the lower layer wiring 51 is not always a shape in which the lateral side portions are parallel to the first direction and the longitudinal side portions are parallel to the second direction as shown in FIG. 5(a).

FIG. 5(b) illustrates a wiring structure according to a modification example of the fifth embodiment of the invention. In the wiring structure of this modification example, in place of the longitudinal side portions $51c_{21}$~$51c_{23}$ of the lower layer wiring 51 of the fifth embodiment, a lower layer wiring has a plurality of oblique side portions parallel to a direction between first and second directions.

In FIG. 5(b), reference numeral 55 designates a wiring structure of a semiconductor device according to a modification example of the fifth embodiment. The same reference numerals as those shown in FIG. 5(a) designate the same parts in the fifth embodiment.

This wiring structure 55 has a lower layer wiring (first wiring) 56 where tensile stresses (thermal stresses) are generated inside, and upper layer wirings (second wirings) 2a and 2b that are electrically connected to the lower layer wiring 56 and are affected by the thermal stresses of the lower layer wiring 56. An end portion $2a_1$ of the upper layer wiring 2a is located on an end portion 56a of the lower layer wiring 56, and connected to the end portion 56a of the lower layer wiring 56 through a contact hole 7a that is formed in an interlayer insulating film, and an end portion $2b_1$ of the upper layer wiring 2b is located on the other end portion 56b of the lower layer wiring 56, and connected to the other end portion 56b of the lower layer wiring 56 through a contact hole 7b that is formed in the interlayer insulating film.

In this case, the lower layer wiring 56 is formed by patterning a platinum layer that is formed on a silicon substrate 5 via an insulating film, and has eight bent portions 57a~57h in a region between the contact holes 7a and 7b. More specifically, a body 56c of the lower layer wiring 56 comprises first to fifth lateral side portions $56c_{11}$~$56c_{15}$ parallel to the first direction D1, second and third longitudinal side portions $56c_{22}$ and $56c_{23}$ parallel to a direction that forms an angle of about +45° with respect to the first direction D1, and first and fourth longitudinal side portions $56c_{21}$ and $56c_{24}$ parallel to a direction that forms an angle of about −45° with respect to the first direction D1, and has a structure in which the lateral side portions and the oblique side portions are alternately connected. Connection portions of the adjacent lateral side portions and oblique side portions are the bent portions 57a~57h, respectively. As a result, the lower layer wiring 56 has a zigzag-shaped plan as a whole.

In the modification example of the fifth embodiment with such a construction, the lower layer wiring 56 having the zigzag plan shape is constituted by alternately arranging the lateral side portions parallel to the first direction D1 and the oblique side portions that form angles of 45° with respect to the first direction. Therefore, the size of the lower layer wiring 56 having the zigzag plan shape in the second direction D2 perpendicular to the first direction D1 is reduced. As a result, the area of the lower layer wiring 56 on the substrate can be reduced, as compared with the area in the fifth embodiment.

In addition, in the fifth embodiment of the invention, as a multilayer wiring structure of the semiconductor device, the wiring structure 50 shown in FIG. 5(a) and the wiring structure 55 as a modification example of the structure 50 (refer to FIG. 5(b)) are described. However, the semiconductor devices according to the fifth embodiment and its modification example may have required one of the wiring structures 10, 20, 30 and 40 described for the first to fourth embodiments, and the conventional wiring structure 250 shown in FIG. 12, in addition to the wiring structures 50 and 55. Further, as another modification example of the fifth embodiment, a structure having both of the wiring structures 50 and 55 can be also considered.

Embodiment 6

Figure 6:
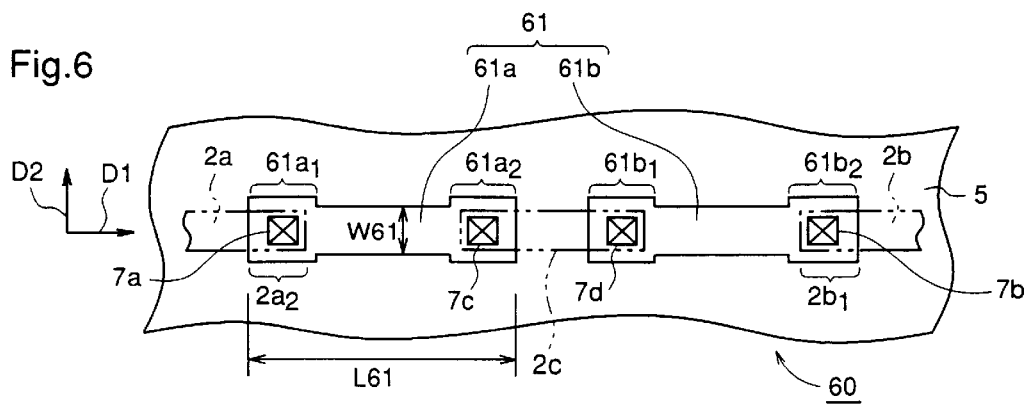
FIG. 6 is a plan view illustrating a wiring structure of a semiconductor device in accordance with a sixth embodiment of the present invention.

FIG. 6 is a plan view for explaining a semiconductor device according to a sixth embodiment of the present invention, which illustrates a wiring structure of the semiconductor device.

In this wiring structure shown in FIG. 6, a lower layer wiring is divided into a plurality of wiring parts, and the wiring parts are connected through other wirings, thereby dispersing and reducing tensile stresses generated in the lower layer wiring. In this case, the length of the lower layer wiring and its tensile stresses basically have a proportional relationship, and it is necessary to determine the lengths of the wiring parts into which the lower layer wiring is divided, in a permissible range of the stresses.

A brief description is given using FIG. 6. In the figure, reference numeral 60 designates a wiring structure of a semiconductor device according to the sixth embodiment of the invention, and its cross-sectional structure is identical to the wiring structure 250 of the conventional semiconductor device.

This wiring structure 60 has a lower layer wiring (first wiring) 61 that extends along a first direction D1 and has a wiring width direction in a second direction perpendicular to the first direction D1, where tensile stresses (thermal stresses) are generated inside, and upper layer wirings (second wirings) 2a and 2b that are electrically connected to the lower layer wiring 61 and are affected by the thermal stresses of the lower layer wiring 61.

In this case, the lower layer wiring 61 is formed by patterning a platinum layer that is formed on a silicon substrate 5 via an insulating film, and has a structure in which the whole is divided into two wiring parts, i.e., first and second wiring parts 61a and 61b, and these parts are electrically connected through a connecting wiring 2c.

The upper layer wirings 2a and 2b and the connecting wiring 2c are formed by patterning an aluminum layer that is formed on the platinum layer via an interlayer insulating film. An end portion $2a_1$ of the upper layer wiring 2a is located on an end portion $61a_1$ of the first wiring part 61a, and connected to the end portion $61a_1$ through a contact hole 7a that is formed in the interlayer insulating film. An end portion $2b_1$ of the upper layer wiring 2b is located on the other end portion $61b_2$ of the second wiring part 61b and connected to the other end portion $61b_2$ through a contact hole 7b that is formed in the interlayer insulating film. The upper layer wiring 2a extends from the contact hole 7a to a direction opposite toward the first direction D1 along the first direction, and the upper layer wiring 2b extends from the contact hole 7b toward the first direction D1 along this direction.

An end portion $2c_1$ of the upper layer wiring 2c is located on the other end portion $61a_2$ of the first wiring part 61a and connected to the other end portion $61a_2$ through a contact hole 7c that is formed in the interlayer insulating film. An end portion $2c_2$ of the upper layer wiring 2c is located on an end portion $61b_1$ of the second wiring part 61b and connected to the end portion $61b_1$ through a contact hole 7d that is formed in the interlayer insulating film.

In the sixth embodiment with such a construction, the lower layer wiring 61 in which the thermal stresses are generated has a structure in which the whole is divided into the two wiring parts 61a and 61b. Therefore, the thermal stresses in the lower layer wiring 61 are dispersed, thereby reducing the thermal stresses that are applied to the upper layer wirings 2a and 2b.

In addition, it has been ascertained from experiments and the like that when the ratio of the wiring length $L_{61}$ of the first or second wiring part to the wiring width $W_{61}$ ($L_{61}/W_{61}$) satisfies $L_{61}/W_{61} \leq 20$, the effect of reducing stresses is remarkable. By setting each wiring part to the ratio in size described above, the thermal stresses in the lower layer wiring can be reduced effectively. Further, by making the plan shape of each wiring part a zigzag plan shape as shown in FIG. 5, the ratio of the wiring length to the wiring width ($L_{61}/W_{61}$) can be made larger.

In the sixth embodiment of the invention, it is not required to form bent portions in the lower layer wiring 61 and the upper layer wirings 2a and 2b. Accordingly, the wiring structure 60 can be realized in a narrow region on the substrate, thereby reducing the occupied area on the substrate, as compared with the respective embodiments.

It is possible to combine the structure of the lower layer wiring according to the sixth embodiment, with the structure of the upper layer wirings according to the first or second embodiment or the structure of the lower layer wiring according to the third or fifth embodiment.

Further, in the sixth embodiment of the invention, there is described a case in which the upper layer wirings 2a and 2b and the connecting wiring 2c are formed by patterning the identical aluminum layer that is formed on the interlayer insulating film. However, the upper layer wirings 2a and 2b and the connecting wiring 2c may be formed by patterning different aluminum layers.

Furthermore, in the sixth embodiment of the invention, as a multilayer wiring structure of the semiconductor device, the wiring structure 60 shown in FIG. 6 is described. However, the semiconductor device according to the sixth embodiment may have required one of the wiring structures 10, 20, 30, 40, 50 and 55 described for the first to fifth embodiments, and the conventional wiring structure 250 shown in FIG. 12, in addition to the wiring structure 60.

Embodiment 7

Figure 7:
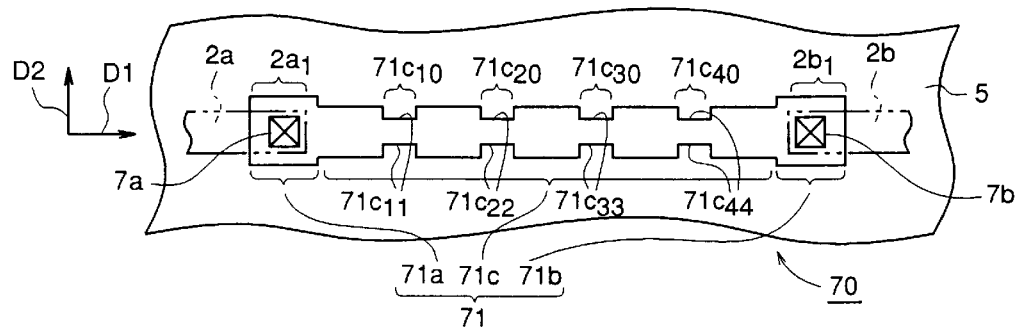
FIG. 7(a) is a plan view illustrating a wiring structure of a semiconductor device in accordance with a seventh embodiment of the present invention.
FIG. 7(b) is a plan view illustrating a wiring structure of a semiconductor device in accordance with a modification example of the seventh embodiment.
Figure 7:
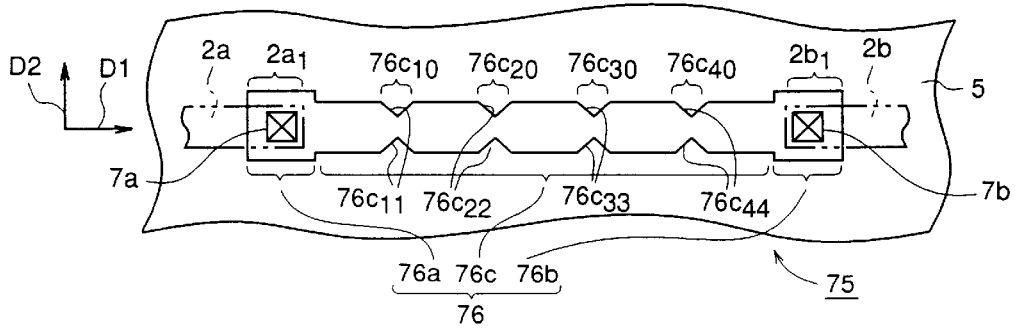

FIG. 7 is a diagram for explaining a semiconductor device according to a seventh embodiment of the present invention, and FIG. 7(a) illustrates a wiring structure of the semiconductor device according to the seventh embodiment.

In the figure, reference numeral 70 designates a wiring structure of a semiconductor device according to the seventh embodiment of the invention, and its cross-sectional structure is identical to the conventional wiring structure. This wiring structure 70 has a lower layer wiring (first wiring) 71 that extends along a first direction D1 and has a wiring width direction in a second direction perpendicular to the first direction D1, where tensile stresses (thermal stresses) are generated, and upper layer wirings (second wirings) 2a and 2b that are electrically connected to the lower layer wiring 71 and are affected by the thermal stresses of the lower layer wiring 71. An end portion $2a_1$ of the upper layer wiring 2a is located on an end portion 71a of the lower layer wiring 71, and connected to the end portion 71a of the lower layer wiring 71 through a contact hole 7a that is formed in an interlayer insulating film. An end portion $2b_1$ of the upper layer wiring 2b is located on the other end portion 71b of the lower layer wiring 71, and connected to the end portion 71b of the lower layer wiring 71 through a contact hole 7b that is formed in the interlayer insulating film.

In this case, the lower layer wiring 71 is formed by patterning a platinum layer that is formed on a silicon substrate 5 via an insulating film, and has narrow wiring width portions $71c_{10}$, $71c_{20}$, $71c_{30}$ and $71c_{40}$ with narrower wiring widths than those of the other portions, the narrow portions being formed by chipping portions of a body $71c$, except the end portions $71a$ and $71b$ connected to the upper layer wirings $2a$ and $2b$. The narrow wiring width portions $71c_{10}$~$71c_{40}$ are formed by chipping the body $71c$ of the lower layer wiring 71 at from both sides at predetermined positions in the wiring path. Reference characters $71c_{11}$, $71c_{22}$, $71c_{33}$ and $71c_{44}$ designate chipped parts of rectangular shapes at the respective narrow wiring width portions $71c_{10}$~$71c_{40}$.

In the seventh embodiment with such a construction, the lower layer wiring 71 in which the thermal stresses are generated has the narrow wiring width portions $71c_{10}$~$71c_{40}$ with narrower wiring widths than those of the other portions, at its portions. Therefore, the lower layer wiring 71 is probable to be transformed by stretching at the narrow wiring width portions, whereby the thermal stresses generated in the lower layer wiring 71 are satisfactorily reduced by the transformation of the narrow wiring width portions. Consequently, breaking of the upper layer wirings $2a$ and $2b$, connection portions of the upper layer wirings and the lower layer wiring 71 and the like due to the tensile stresses being generated in the lower layer wiring 71 can be suppressed, leading to improved reliability of the semiconductor device.

In addition, the shape of the chipped part at each narrow wiring width portion of the lower layer wiring is not always a rectangular shape as shown in FIG. 7($a$).

For example, FIG. 7($b$) illustrates a wiring structure according to a modification example of the seventh embodiment of the invention. In this wiring structure, the shape of a chipped part at each narrow wiring width portion of a lower layer wiring is a V shape.

More specifically, in FIG. 7($b$), reference numeral 75 designates a wiring structure of a semiconductor device according to a modification example of the seventh embodiment. The same reference numerals as those shown in FIG. 7($a$) designate the same parts as the wiring structure 70 in the seventh embodiment.

This wiring structure 75 has a lower layer wiring (first wiring) 76 that extends along a first direction D1 and has a wiring width direction in a second direction perpendicular to the first direction D1, where tensile stresses (thermal stresses) are generated, and upper layer wirings (second wirings) $2a$ and $2b$ that are electrically connected to the lower layer wiring 76 and are affected by the thermal stresses of the lower layer wiring 76. An end portion $2a_1$ of the upper layer wiring $2a$ is located on an end portion $76a$ of the lower layer wiring 76, and connected to the end portion $76a$ of the lower layer wiring 76 through a contact hole $7a$ that is formed in an interlayer insulating film. An end portion $2b_1$ of the upper layer wiring $2b$ is located on the other end portion $76b$ of the lower layer wiring 76, and connected to the end portion $76b$ of the lower layer wiring 76 through a contact hole $7b$ that is formed in the interlayer insulating film.

In this case, the lower layer wiring 76 is formed by patterning a platinum layer that is formed on a silicon substrate 5 via an insulating film, and has narrow wiring width portions $76c_{10}$, $76c_{20}$, $76c_{30}$ and $76c_{40}$ with narrower wiring widths than those of the other portions, the narrow portions being formed by chipping portions of a body $76c$, except the end portions $76a$ and $76b$ connected to the upper layer wirings $2a$ and $2b$. The narrow wiring width portions $76c_{10}$~$76c_{40}$ are formed by chipping the body $76c$ of the lower layer wiring 76 from both sides at predetermined positions in the wiring path. Reference characters $76c_{11}$, $76c_{22}$, $76c_{33}$ and $76c_{44}$ designate chipped parts of V shapes at the respective narrow wiring width portions $76c_{10}$~$76c_{40}$.

In the modification example of the seventh embodiment with such a construction, the shapes of the chipped parts $76c_{11}$~$76c_{44}$ of the narrow wiring width portions $76c_{10}$~$76c_{40}$ are V shapes. Therefore, as compared with the chipped parts $71c_{11}$~$71c_{44}$ of rectangular shapes according to the seventh embodiment, the areas of the chipped parts in the lower layer wiring 76 can be reduced, whereby it is more advantageous when elements, such as capacitors, are disposed on the lower layer wiring 76.

In the seventh embodiment of the invention, as a multi-layer wiring structure of the semiconductor device, the wiring structure 70 shown in FIG. 7($a$) and the wiring structure 75 as a modification example of the structure 70 (refer to FIG. 7($b$)) are described. However, the semiconductor devices according to the seventh embodiment and its modification example may have required one of the wiring structures 10, 20, 30, 40, 50, 55 and 60 described for the first to sixth embodiments, and the conventional wiring structure 250 shown in FIG. 12, in addition to the wiring structures 70 and 75. Further, as another modification example of the seventh embodiment, a structure having both of the wiring structures 70 and 75 can be also considered.

Embodiment 8

Figure 8:
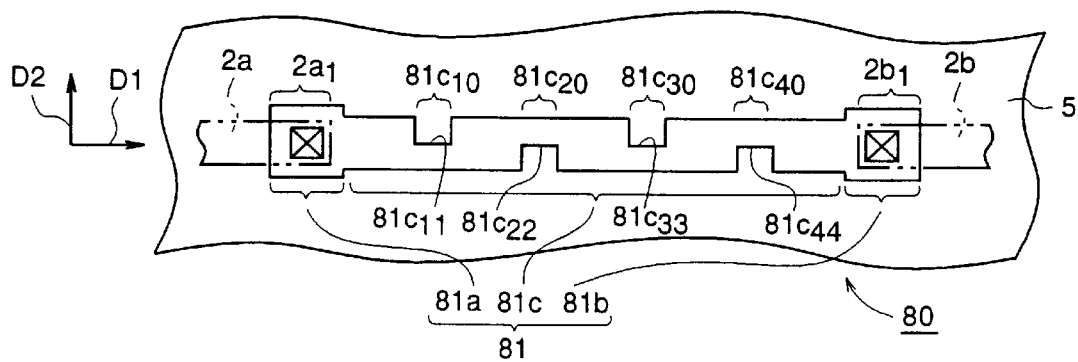
FIG. 8(a) is a plan view illustrating a wiring structure of a semiconductor device in accordance with an eighth embodiment of the present invention.
FIG. 8(b) is a plan view illustrating a wiring structure of a semiconductor device in accordance with a first modification example of the eighth embodiment.
FIG. 8(c) is a plan view illustrating a wiring structure of a semiconductor device in accordance with a second modification example of the eighth embodiment.
Figure 8:
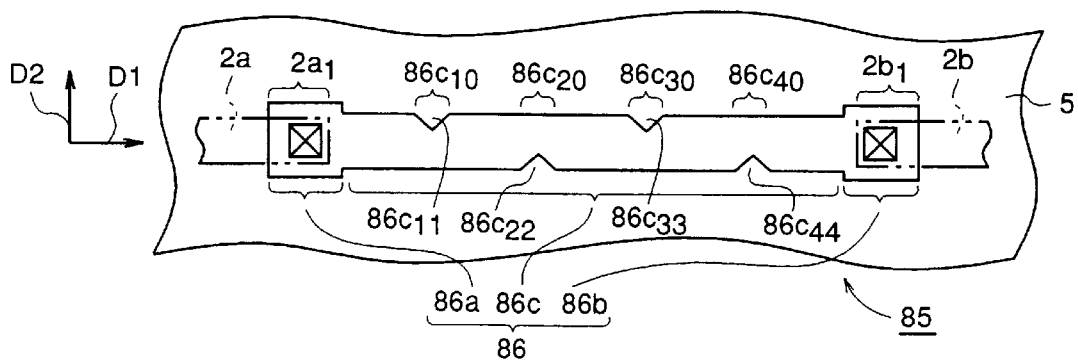
Figure 8:
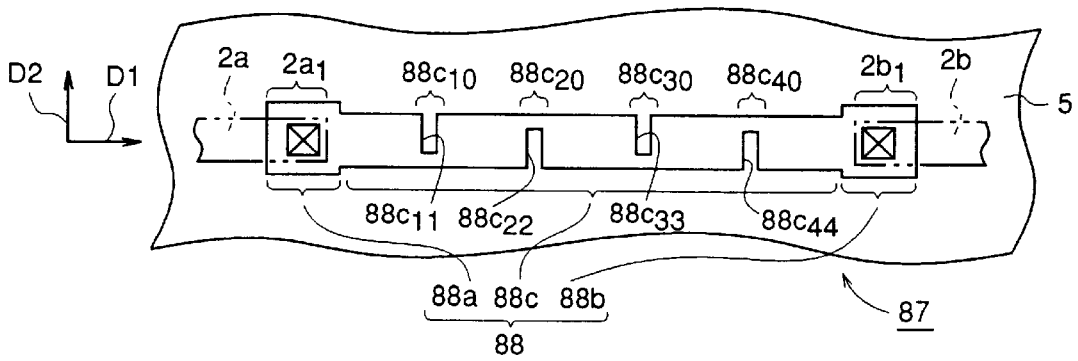

FIG. 8 is a diagram for explaining a semiconductor device according to an eighth embodiment of the present invention, and FIG. 8($a$) illustrates a wiring structure of the semiconductor device according to the eighth embodiment.

In the figure, reference numeral 80 designates a wiring structure of a semiconductor device according to the eighth embodiment of the invention, and its cross-sectional structure is identical to the conventional wiring structure.

This wiring structure 80 has a lower layer wiring (first wiring) 81 that extends along a first direction D1 and has a wiring width direction in a second direction perpendicular to the first direction D1, where tensile stresses (thermal stresses) are generated, and upper layer wirings (second wirings) $2a$ and $2b$ that are electrically connected to the lower layer wiring 81 and are affected by the thermal stresses of the lower layer wiring 81.

In this case, the lower layer wiring 81 is formed by patterning a platinum layer that is formed on a silicon substrate 5 via an insulating film. A body $81c$, except end portions $81a$ and $81b$ that are connected to the upper layer wirings $2a$ and $2b$, has first narrow wiring width portions $81c_{10}$ and $81c_{30}$ with narrower wiring widths than those of the other portions, the narrow portions being formed by chipping one side of the body $81c$, and second narrow wiring width portions $81c_{20}$ and $81c_{40}$ with narrower wiring widths than those of the other portions, the narrow portions being formed by chipping the other side of the body $81c$. The first narrow wiring width portions $81c_{10}$ and $81c_{30}$, and the second narrow wiring width portions $81c_{20}$ and $81c_{40}$ are alternately arranged along the first direction D1. Reference characters $81c_{11}$, $81c_{22}$, $81c_{33}$ and $81c_{44}$ designate chipped parts of rectangular shapes at the respective narrow wiring width portions $81c_{10}$~$81c_{40}$.

In the eighth embodiment with such a construction, the lower layer wiring 81 in which the thermal stresses are generated has the narrow wiring width portions $81c_{10}$~$81c_{40}$ with narrower wiring widths than those of the other portions, at its portions. Therefore, the lower layer wiring 81 can be easily transformed by stretching at the narrow wiring width portions, whereby the thermal stresses generated in the lower layer wiring 81 are satisfactorily reduced by the transformation of the narrow wiring width portions.

Consequently, breaking of the upper layer wirings 2a and 2b, connection portions of the upper layer wirings and the lower layer wiring 81 and the like due to the tensile stresses being generated in the lower layer wiring 81 can be suppressed, leading to improved reliability of the semiconductor device.

Further, in the eighth embodiment of the invention, the chipped parts $81c_{11}$ and $81c_{33}$ at one side of the lower layer wiring 81, and the chipped parts $81c_{22}$ and $81c_{44}$ at the other side of the lower layer wiring 81 are alternately arranged along the wiring path. Therefore, the lower layer wiring 81 is transformed by stretching at the narrow wiring width portions $81c_{10}$~$81c_{40}$ due to the tensile stresses, as well as the chipped parts $81c_{11}$~$81c_{44}$ are transformed by curving so that their openings become wider. Accordingly, by the transformation by stretching and the transformation by curving, the tensile stresses in the lower layer wiring are exceedingly reduced. As a result, production of breaking of the upper layer wirings 2a and 2b connected to the lower layer wiring 81, connection portions of the lower layer wiring and the upper layer wirings and the like can be exceedingly reduced.

In addition, the shape of the chipped part at each narrow wiring width portion of the lower layer wiring is not always a rectangular shape as shown in FIG. 8(a).

FIG. 8(b) illustrates a wiring structure according to a first modification example of the eighth embodiment of the invention. In this wiring structure, the shape of a chipped part at each narrow wiring width portion of a lower layer wiring is a V shape.

More specifically, in FIG. 8(b), reference numeral 85 designates a wiring structure of a semiconductor device according to a first modification example of the eighth embodiment. The same reference numerals as those shown in FIG. 8(a) designate the same parts as the wiring structure 80 in the eighth embodiment.

This wiring structure 85 has a lower layer wiring (first wiring) 86 that extends along a first direction D1 and has a wiring width direction in a second direction perpendicular to the first direction D1, where tensile stresses (thermal stresses) are generated, and upper layer wirings (second wirings) 2a and 2b that are electrically connected to the lower layer wiring 86 and are affected by the thermal stresses of the lower layer wiring 86. An end portion $2a_1$ of the upper layer wiring 2a is located on an end portion 86a of the lower layer wiring 86, and connected to the end portion 86a of the lower layer wiring 86 through a contact hole 7a that is formed in an interlayer insulating film. An end portion $2b_1$ of the upper layer wiring 2b is located on the other end portion 86b of the lower layer wiring 86, and connected to the end portion 86b of the lower layer wiring 86 through a contact hole 7b that is formed in the interlayer insulating film.

In this case, the lower layer wiring 86 is formed by patterning a platinum layer that is formed on a silicon substrate 5 via an insulating film. A body 86c of this lower layer wiring 86, except the end portions 86a and 86b connected to the upper layer wirings 2a and 2b, has first narrow wiring width portions $86c_{10}$ and $86c_{30}$ with narrower wiring widths than those of the other portions, the narrow portions being formed by chipping one side of the body 86c, and second narrow wiring width portions $86c_{20}$ and $86c_{40}$ with narrower wiring widths than those of the other portions, the narrow portions being formed by chipping the other side of the body 86c. The first narrow wiring width portions $86c_{10}$ and $86c_{30}$, and the second narrow wiring width portions $86c_{20}$ and $86c_{40}$ are alternately arranged along the first direction D1. Reference characters $86c_{11}$, $86c_{22}$, $86c_{33}$ and $86c_{44}$ designate chipped parts of V shapes at the respective narrow wiring width portions $86c_{10}$~$86c_{40}$.

In the modification example of the eighth embodiment with such a construction, the shapes of the chipped parts $86c_{11}$~$86c_{44}$ of the narrow wiring width portions $86c_{10}$~$86c_{40}$ are V shapes. Therefore, as compared with the chipped parts $81c_{11}$~$81c_{44}$ of rectangular shapes according to the eighth embodiment, the areas of the chipped parts in the lower layer wiring 86 can be reduced. It is more advantageous when elements, such as capacitors, are disposed on the lower layer wiring 86.

FIG. 8(c) illustrates a wiring structure according to a second modification example of the eighth embodiment of the invention. In this wiring structure, wiring widths of first and second narrow wiring width portions of a lower layer wiring are smaller than ½ of wiring widths of portions of the lower layer wiring body, except the narrow wiring width portions.

More specifically, in FIG. 8(c), reference numeral 87 designates a wiring structure of a semiconductor device according to a second modification example of the eighth embodiment. The same reference numerals as those shown in FIG. 8(a) designate the same parts as the wiring structure 80 in the eighth embodiment.

This wiring structure 87 has a lower layer wiring (first wiring) 88 that extends along a first direction D1 and has a wiring width direction in a second direction perpendicular to the first direction D1, where tensile stresses (thermal stresses) are generated, and upper layer wirings (second wirings) 2a and 2b that are electrically connected to the lower layer wiring 88 and are affected by the thermal stresses of the lower layer wiring 88. An end portion $2a_1$ of the upper layer wiring 2a is located on an end portion 88a of the lower layer wiring 88, and connected to the end portion 88a of the lower layer wiring 88 through a contact hole 7a that is formed in an interlayer insulating film. An end portion $2b_1$ of the upper layer wiring 2b is located on the other end portion 88b of the lower layer wiring 88, and connected to the end portion 88b of the lower layer wiring 88 through a contact hole 7b that is formed in the interlayer insulating film.

In this case, the lower layer wiring 88 is formed by patterning a platinum layer that is formed on a silicon substrate 5 via an insulating film. A body 88c of this lower layer wiring 88, except the end portions 88a and 88b connected to the upper layer wirings 2a and 2b, has first narrow wiring width portions $88c_{10}$ and $88c_{30}$ with narrower wiring widths than those of the other portions, the narrow portions being formed by chipping one side of the body 88c, and second narrow wiring width portions $88c_{20}$ and $88c_{40}$ with narrower wiring widths than those of the other portions, the narrow portions being formed by chipping the other side of the body 88c. The first narrow wiring width portions $88c_{10}$ and $88c_{30}$, and the second narrow wiring width portions $88c_{20}$ and $88c_{40}$ are alternately arranged along the first direction D1. The wiring widths of the respective narrow wiring width portions $88c_{10}$~$88c_{40}$ are smaller than ½ of the wiring widths of portions of the wiring body 88c, except the narrow wiring width portions. In other words, the current path along the center line of the lower layer wiring 88 is divided into parts by chipped parts $88c_{11}$, $88c_{22}$, $88c_{33}$ and $88c_{44}$ of rectangular shapes at the respective narrow wiring width portions $88c_{10}$, $88c_{20}$, $88c_{30}$ and $88c_{40}$.

In the second modification example of the eighth embodiment with such a construction, the wiring widths of the respective narrow wiring width portions $88c_{10}$~$88c_{40}$ are smaller than ½ of the wiring widths of portions of the wiring body 88*c*, except the narrow wiring width portions. Therefore, in the narrow wiring width portions at which the chipped parts are formed, there occurs not only transformation by stretching but transformation by curving due to the thermal stresses of the lower layer wiring. As a result, as compared with the narrow portions of the eighth embodiment, the narrow wiring width portions can be very easily transformed by the thermal stresses of the lower layer wiring, whereby breaking of the upper layer wirings and connection portions of the upper layer wirings and the lower layer wiring due to the thermal stresses can be further suppressed.

In addition, in the eighth embodiment of the invention, as a multilayer wiring structure of the semiconductor device, the wiring structure 80 shown in FIG. 8(*a*), the wiring structure 85 as a first modification example of the structure 80 (refer to FIG. 8(*b*)), and the wiring structure 87 as a second modification example of the structure 80 (refer to FIG. 8(*c*)) are described. However, the semiconductor devices according to the eighth embodiment and its first and second modification examples may have required one of the wiring structures 10, 20, 30, 40, 50, 55, 60, 70 and 75 described for the first to seventh embodiments, and the conventional wiring structure 250 shown in FIG. 12, in addition to the wiring structures 80, 85 and 87. Further, as another modification example of the eighth embodiment, a structure having two of the wiring structures 80, 85 and 87 or all of these three wiring structures can be also considered.
Embodiment 9

Figure 9:
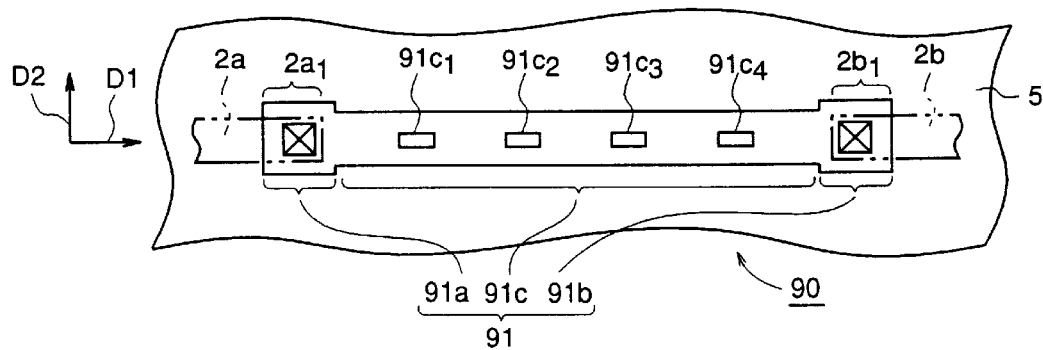
FIG. 9(a) is a plan view illustrating a wiring structure of a semiconductor device in accordance with a ninth embodiment of the present invention.
FIG. 9(b) is a plan view illustrating a wiring structure of a semiconductor device in accordance with a modification example of the ninth embodiment.
Figure 9:
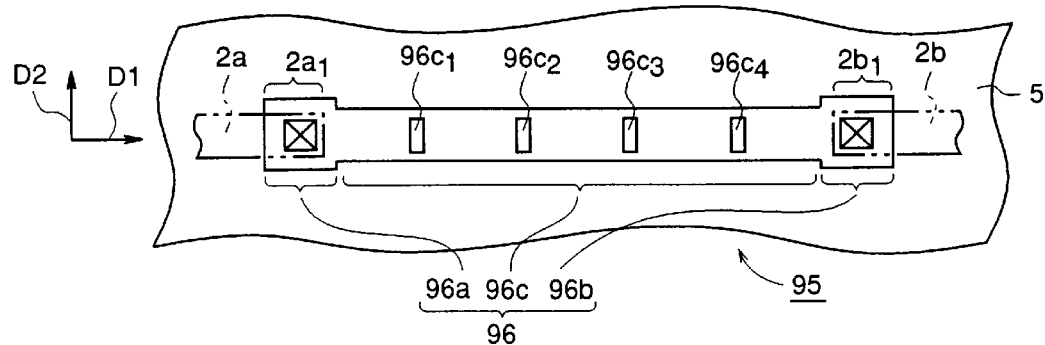

FIG. 9 is a diagram for explaining a semiconductor device according to a ninth embodiment of the present invention, and FIG. 9(*a*) illustrates a wiring structure of the semiconductor device according to the ninth embodiment.

In the figure, reference numeral 90 designates a wiring structure of a semiconductor device according to the ninth embodiment of the invention, and its cross-sectional structure is identical to the conventional wiring structure 250.

This wiring structure 90 has a lower layer wiring (first wiring) 91 that extends along a first direction D1 and has a wiring width direction in a second direction perpendicular to the first direction D1, where tensile stresses are generated inside, and upper layer wirings (second wirings) 2*a* and 2*b* that are electrically connected to the lower layer wiring 91 and are affected by the thermal stresses of the lower layer wiring 91. An end portion $2a_1$ of the upper layer wiring 2*a* is located on an end portion 91*a* of the lower layer wiring 91, and connected to the end portion 91*a* of the lower layer wiring 91 through a contact hole 7*a* that is formed in an interlayer insulating film. An end portion $2b_1$ of the upper layer wiring 2*b* is located on the other end portion 91*b* of the lower layer wiring 91, and connected to the end portion 91*b* of the lower layer wiring 91 through a contact hole 7*b* that is formed in the interlayer insulating film.

In this case, the lower layer wiring 91 is formed by patterning a platinum layer that is formed on a silicon substrate 5 via an insulating film. A body 91*c*, except the end portions 91*a* and 91*b* connected to the upper layer wirings 2*a* and 2*b*, has a plurality of through openings $91c_1 \sim 91c_4$ at predetermined intervals along the first direction D1. These through openings $91c_1 \sim 91c_4$ have rectangular shapes, and its longitudinal direction matches with the first direction D1.

In the ninth embodiment with such a construction, the lower layer wiring 91 in which the thermal stresses are generated has the plurality of through openings $91c_1 \sim 91c_4$ that are disposed along the longitudinal direction of the wiring (first direction) D1. Therefore, portions of the body 91*c* of the lower layer wiring 91 in which the through openings are formed can be easily transformed by stretching due to the thermal stresses being generated in the lower layer wiring 91, whereby the thermal stresses in the lower layer wiring 91 are satisfactorily reduced. Consequently, breaking of the upper layer wirings 2*a* and 2*b*, connection portions of the upper layer wirings and the lower layer wiring 91 and the like due to the thermal stresses in the lower layer wiring 91 can be suppressed, leading to improved reliability of the semiconductor device.

In addition, the shape of each through opening of the lower layer wiring is not always a rectangular shape having the first direction D1 as its longitudinal direction as shown in FIG. 9(*a*).

For example, FIG. 9(*b*) illustrates a wiring structure according to a modification example of the ninth embodiment of the invention. In this wiring structure, through openings of a lower layer wiring have rectangular shapes having a second direction D2 perpendicular to the first direction D1 as its longitudinal direction.

More specifically, in FIG. 9(*b*), reference numeral 95 designates a wiring structure of a semiconductor device according to a modification example of the ninth embodiment. The same reference numerals as those shown in FIG. 9(*a*) designate the same parts as those in the ninth embodiment.

This wiring structure 95 has a lower layer wiring (first wiring) 96 that extends along a first direction D1 and has a wiring width direction in a second direction perpendicular to the first direction D1, where tensile stresses (thermal stresses) are generated inside, and upper layer wirings (second wirings) 2*a* and 2*b* that are electrically connected to the lower layer wiring 96 and are affected by the thermal stresses of the lower layer wiring 96. An end portion $2a_1$ of the upper layer wiring 2*a* is located on an end portion 96*a* of the lower layer wiring 96, and connected to the end portion 96*a* of the lower layer wiring 96 through a contact hole 7*a* that is formed in an interlayer insulating film. An end portion $2b_1$ of the upper layer wiring 2*b* is located on the other end portion 96*b* of the lower layer wiring 96, and connected to the other end portion 96*b* of the lower layer wiring 96 through a contact hole 7*b* that is formed in the interlayer insulating film.

In this case, the lower layer wiring 96 is formed by patterning a platinum layer that is formed on a silicon substrate 5 via an insulating film. A body 96*c*, except the end portions 96*a* and 96*b* connected to the upper layer wirings 2*a* and 2*b*, has a plurality of through openings $96c_1 \sim 96c_4$ at predetermined intervals along the first direction D1. These through openings $96c_1 \sim 96c_4$ have rectangular shapes, and its longitudinal direction matches with the second direction D2 perpendicular to the first direction D1.

In the modification example of the ninth embodiment with such a construction, the lower layer wiring 96 in which the thermal stresses are generated has the plurality of through openings $96c_1 \sim 96c_4$ of rectangular shapes that are disposed along its wiring direction, and the longitudinal direction of the through openings $96c_1 \sim 96c_4$ of rectangular shapes matches with the second direction D2 perpendicular to the wiring direction of the lower layer wiring 96 (first direction) D1. Therefore, at portions of the body 96*c* of the lower layer wiring 96 in which the through openings are formed, substantial wiring widths are smaller than those in the ninth embodiment, whereby the portions can be more easily transformed by stretching due to the thermal stresses being generated in the lower layer wiring 96. Thereby, the thermal stresses in the lower layer wiring 96 are reduced more effectively. Consequently, breaking of the upper layer wirings 2a and 2b, connection portions of the upper layer wirings and the lower layer wiring 96 and the like due to the thermal stresses in the lower layer wiring 96 can be further suppressed, leading to further improved reliability of the semiconductor device.

In addition, in the ninth embodiment of the invention, as a multilayer wiring structure of the semiconductor device, the wiring structure 90 shown in FIG. 9(*a*) and the wiring structure 95 as a modification example of the structure 90 (refer to FIG. 9(*b*)) are described. However, the semiconductor devices according to the ninth embodiment and its modification example may have required one of the wiring structures 10, 20, 30, 40, 50, 55, 60, 70, 75, 80, 85 and 87 described for the first to eighth embodiments, and the conventional wiring structure 250 shown in FIG. 12, in addition to the wiring structures 90 and 95. Further, as another modification example of the ninth embodiment, there is considered a structure that realizes both of the wiring structures 90 and 95.

In any of the first to ninth embodiments of the invention, although the lower layer wiring comprises platinum, the composing material of the lower layer wiring is not always platinum but may be a metallic material of a high melting point, such as iridium, titanium, and tungsten.

Further, in any of the first to ninth embodiments of the invention, there is described the wiring structure in which thermal stresses are generated in the lower layer wiring, and the upper layer wirings are affected by the thermal stresses. However, this may be a wiring structure in which thermal stresses are generated in upper layer wirings, and a lower layer wiring is affected by the thermal stresses.

Furthermore, in any of the first to ninth embodiments of the invention, although there is described the case where tensile stresses are generated in the lower layer wiring, this lower layer wiring may be one in which expansion stresses are generated.

Figure 13:
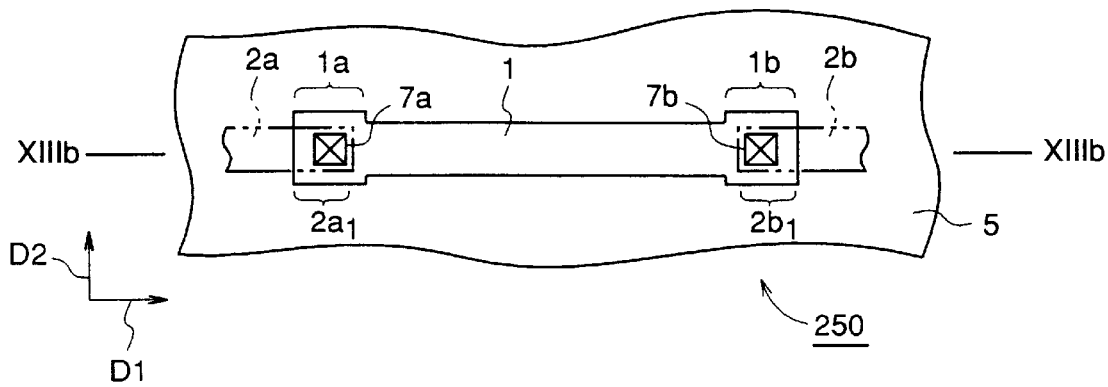
FIG. 13(a) is a plan view illustrating a wiring structure of a conventional semiconductor device.
FIG. 13(b) is its cross-sectional view and FIG. 13(c) shows another embodiment of its cross-sectional view.
Figure 13:
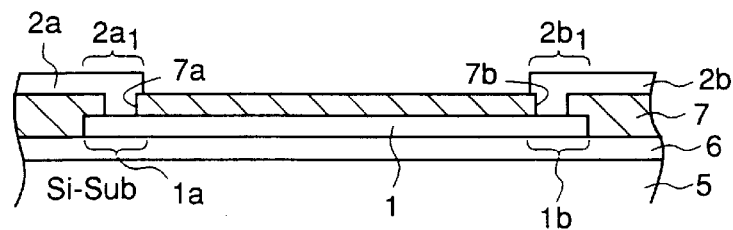
Figure 13:
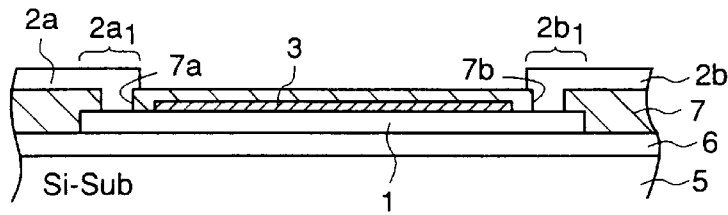
Figure 14:
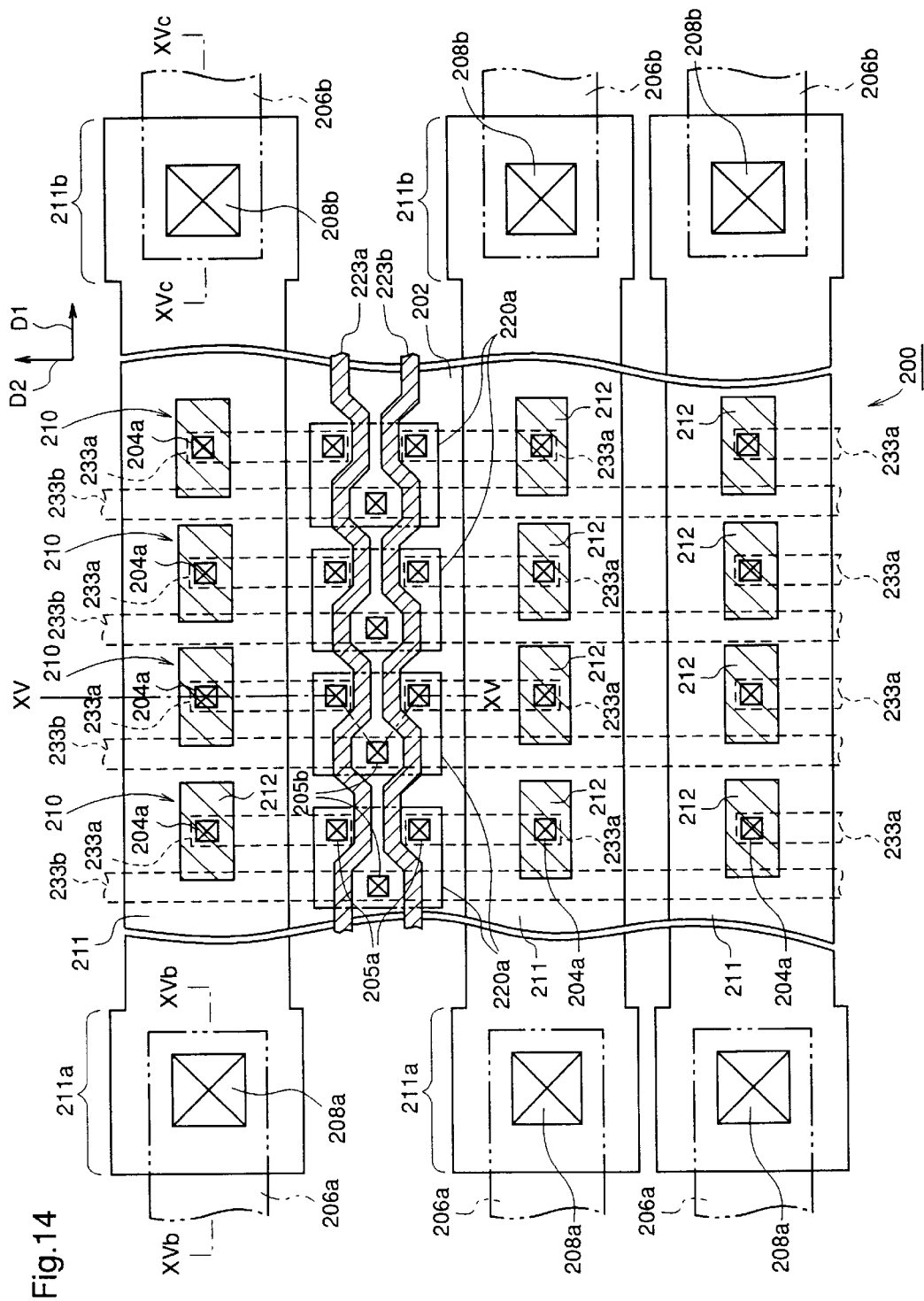
FIG. 14 is a plan view illustrating a memory cell array of a conventional ferroelectric memory device.
Figure 15:
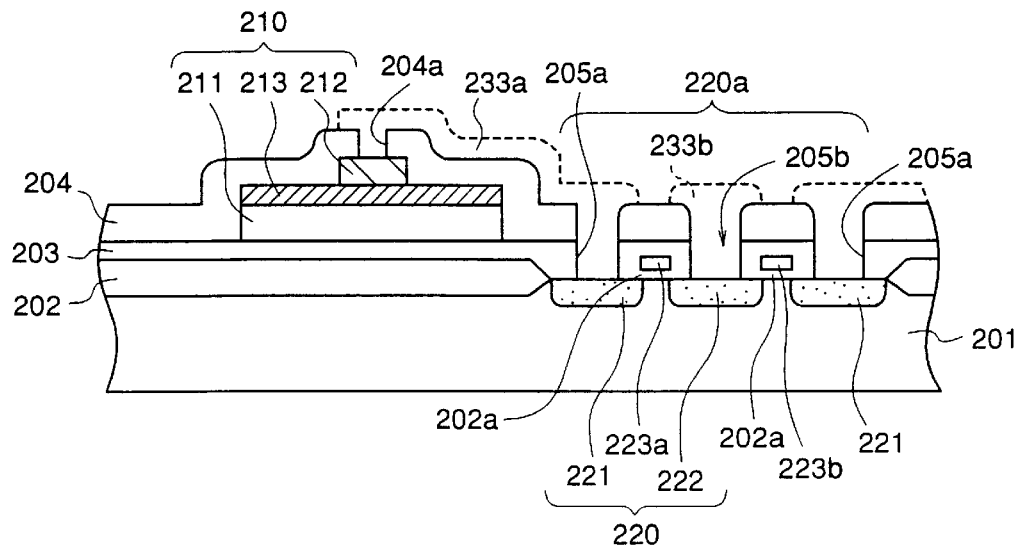
FIG. 15(a) is a cross-sectional view of a part along a line XVa—XVa shown in FIG. 14.
FIG. 15(b) is a cross-sectional view of a part along a line XVb—XVb shown in FIG. 14.
FIG. 15(c) is a cross-sectional view of a part along a line XVc—XVc shown in FIG. 14.
Figure 15:
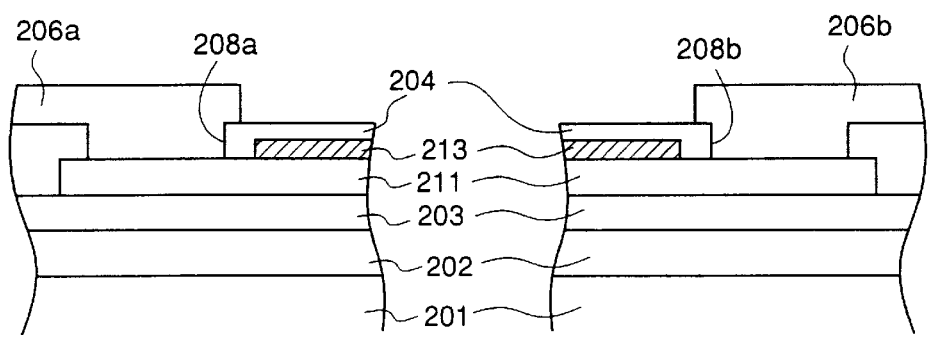

Furthermore, in any of the first to ninth embodiments of the invention, there is described the lower layer wiring merely comprising a metallic material. However, in a semiconductor device in which a lower layer wiring and a lower electrode (cell plate electrode) constituting, for example, ferroelectric capacitors of a ferroelectric memory device, are formed by patterning the identical metallic layer, the lower layer wiring may have a structure in which a ferroelectric layer is formed on its surface as shown in FIG. 13(*c*).

Furthermore, in any of the first to ninth embodiments of the invention, although the wiring structure having the upper layer wirings and the lower layer wiring is described, the structure of the lower layer wiring in the wiring structure according to any of the third to ninth embodiments can be employed for a lower electrode and upper electrodes constituting ferroelectric capacitors of a ferroelectric memory device.

For example, the structure of the lower layer wiring of any of the seventh and eighth embodiments is effective when the lower layer wiring is used as a lower electrode of ferroelectric capacitors, and a ferroelectric layer and upper electrodes of the ferroelectric capacitors are disposed on regions of the lower layer wiring, except the narrow wiring width portions, thereby constituting the plurality of ferroelectric capacitors on the lower layer wiring. In addition, concerning the structure of the lower layer wiring of the ninth embodiment, the lower layer wiring is used as a lower electrode of ferroelectric capacitors, and a ferroelectric layer and upper electrodes of the ferroelectric capacitors are disposed on regions of the lower layer wiring, except the portions in which the through openings are formed, thereby constituting the plurality of ferroelectric capacitors on the lower layer wiring.

The upper layer wirings in the wiring structure of any of the first and second embodiments can be employed as upper layer wirings that are connected to both ends of a lower electrode constituting ferroelectric capacitors of a ferroelectric memory device.

Embodiment 10

In a tenth embodiment of the present invention, a description is given of a device in which the structure of the lower layer wiring according to any of the fifth and sixth embodiments is used for lower electrodes constituting ferroelectric capacitors of a ferroelectric memory device, and the structure of the upper layer wirings according to the first embodiment is used as upper layer wirings for connecting division parts of the lower electrodes of the ferroelectric memory device.

Figure 10:
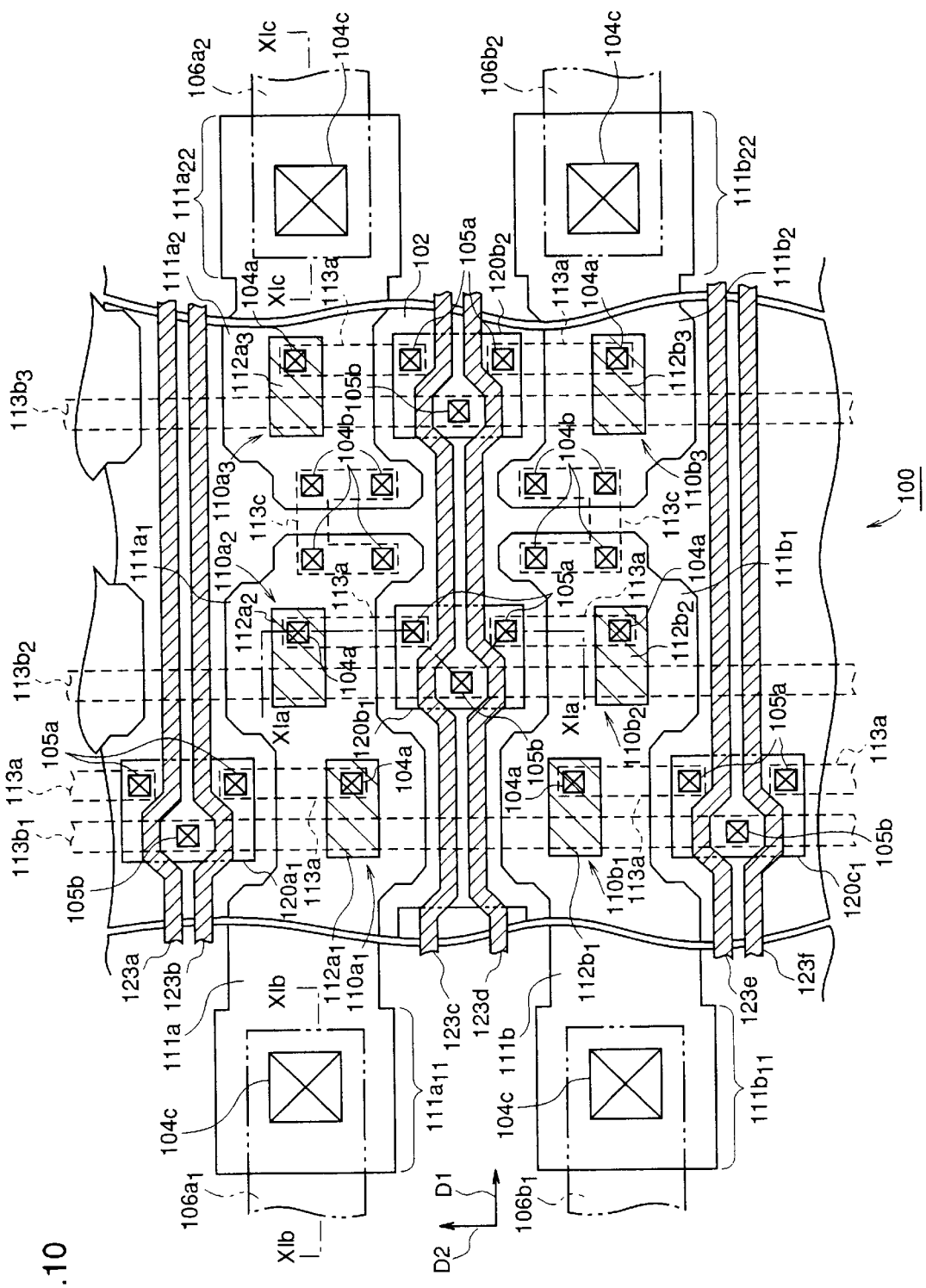
FIG. 10 is a plan view illustrating a memory cell array of a ferroelectric memory device in accordance with a tenth embodiment of the present invention.
Figure 11:
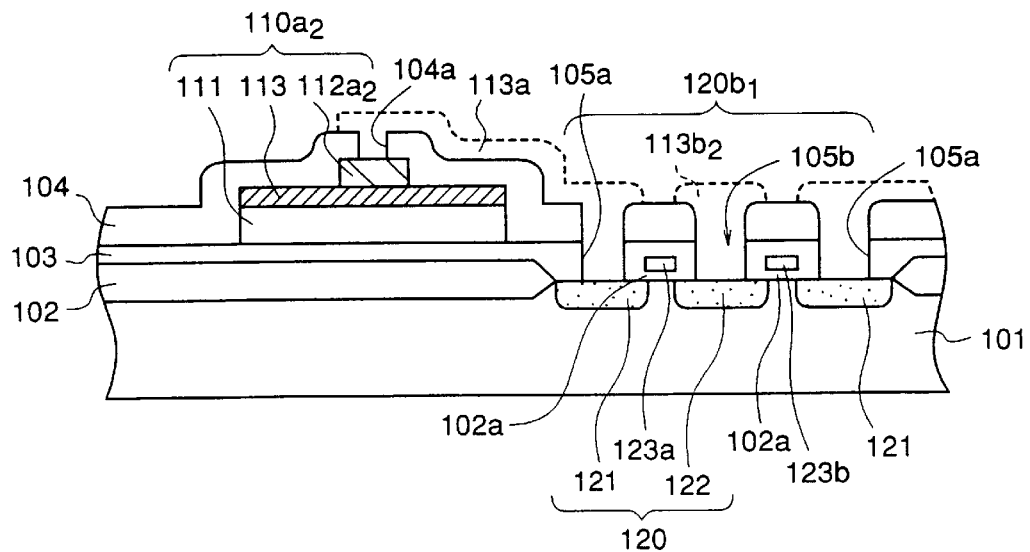
FIG. 11(a) is a cross-sectional view of a part along a line XIa—XIa shown in FIG. 10.
FIG. 11(b) is a cross-sectional view of a part along a line XIb—XIb shown in FIG. 10.
FIG. 11(c) is a cross-sectional view of a part along a line XIc—XIc shown in FIG. 10.
Figure 11:
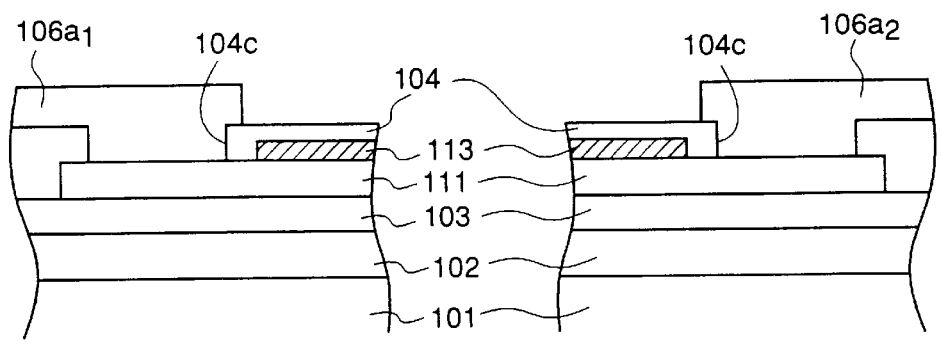
Figure 12:
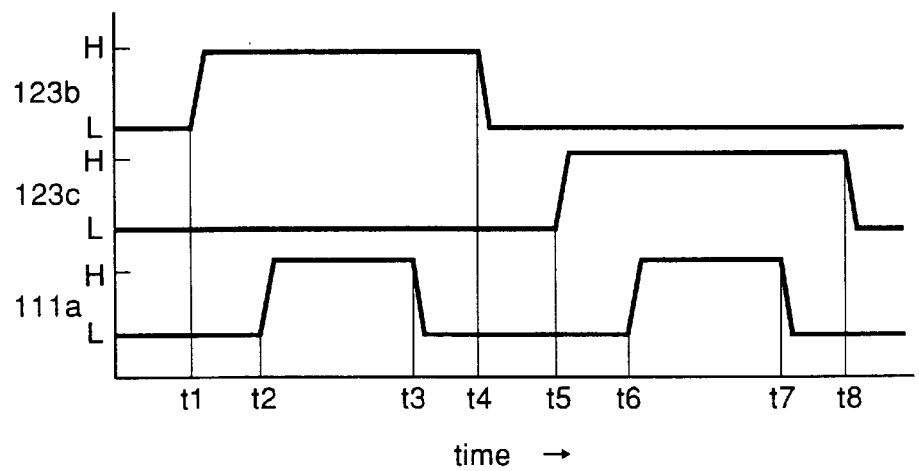
FIG. 12(a) is a diagram for explaining an operation of the ferroelectric memory device in accordance with the tenth embodiment of the invention.
FIG. 12(b) is a diagram for explaining an operation of a ferroelectric memory device in accordance with a modification example of the tenth embodiment.
Figure 12:
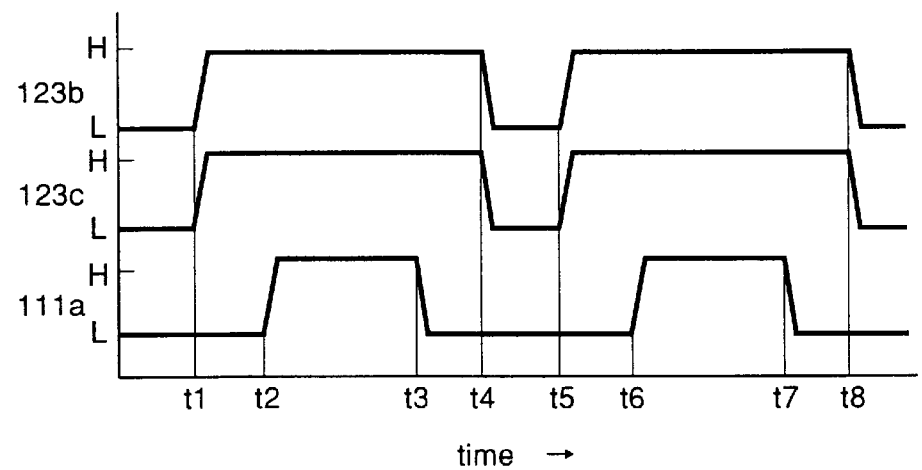

FIG. 10 is a plan view for explaining a ferroelectric memory device according to a tenth embodiment of the present invention, which illustrates a memory cell array in the ferroelectric memory device. FIG. 11(*a*) is a cross-sectional view of a part along a line XIa—XIa shown in FIG. 10, FIG. 11(*b*) is a cross-sectional view of a part along a line XIb—XIb shown in FIG. 10, and FIG. 11(*c*) is a cross-sectional view of a part along a line XIc—XIc shown in FIG. 10. FIG. 12 is a timing chart for explaining an operation of this ferroelectric memory device.

In the figures, reference numeral 100 designates a memory cell array constituting a ferroelectric memory device. On a silicon substrate 101, transistor regions (in FIG. 10, only transistor regions $120a_1$, $120b_1$, $120b_2$ and $120c_1$ are shown) are arranged in the form of a matrix along a first direction D1 and a second direction D2 perpendicular to the first direction, and an insulating film 102 for element isolation is formed on a surface region of the silicon substrate 101, except the respective transistor regions.

Lower electrodes (first electrodes) (in FIG. 10, only lower electrodes 111a and 111b are shown) are disposed as cell plate electrodes, adjacently to the transistor regions of respective lines along the first direction D1. The lower electrodes 111a and 111b are formed by patterning a metallic film comprising a metallic material of a high melting point, such as platinum, iridium, tungsten and titanium, and disposed on the insulating film 102 for element isolation via interlayer insulating films 103. Further, the lower electrodes extend along the first direction D1, and have stripe-shaped plans having the second direction perpendicular to the first direction as a wiring width direction. On surfaces of the lower electrodes, ferroelectric layers 113 are formed.

On the ferroelectric layers 113 on the surfaces of the respective lower electrodes, upper electrodes (second electrodes) (in FIG. 10, only upper electrodes $112a_1$, $112a_2$, $112a_3$, $112b_1$, $112b_2$ and $112b_3$ are shown) that are formed by patterning a metallic film comprising a metallic material of a high melting point, such as platinum, iridium, tungsten and titanium, are formed. That is, on the ferroelectric layers 113 on the respective lower electrodes, the plurality of upper electrodes are arranged along the first direction D1. A plan shape of each upper electrode is a rectangular shape having the first direction D1 as a longitudinal direction. In addition, the area of each upper electrode is smaller than that of the lower electrode. The surfaces of the ferroelectric layers 113 and the surfaces of the upper electrodes are covered with second interlayer insulating films 104.

Here, the lower electrode 111a, the upper electrodes $112a_1$, $112a_2$ and $112a_3$ that are located above the lower electrode, and the ferroelectric layer 113 located between the lower electrode and the upper electrodes constitute ferroelectric capacitors $110a_1$, $110a_2$ and $110a_3$. The lower electrode 111b, the upper electrodes 112b₁, 112b₂ and 112b₃ that are located above the lower electrode, and the ferroelectric layer 113 between the lower electrode and the upper electrodes constitute ferroelectric capacitors 110b₁, 110b₂ and 110b₃. The ferroelectric capacitor 110a₁ corresponds to the transistor region 120a₁, the ferroelectric capacitors 110a₂ and 110b₂ correspond to the transistor region 120b₁, and the ferroelectric capacitors 110a₃ and 110b₃ correspond to the transistor region 120b₂.

In the tenth embodiment of the invention, in order to reduce variations in the characteristics of the respective ferroelectric capacitors 110, i.e., variations in polarizability of the ferroelectric layers, and make changes in the characteristic, i.e., changes in polarizability with passage of time, less, considering tensile stresses (thermal stresses) generated in the lower electrode and the like, the distances between the adjacent upper electrodes and the areas of the upper electrodes on the lower electrode are made suitable.

Between both of the lower electrodes that sandwich the transistor regions opposing to each other, a pair of word lines (in FIG. 10, only word lines 123a, 123b, 123c, 123d, 123e and 123f are shown) comprising polysilicon is disposed so as to straddle over the plurality of transistor regions arranged in a line. A source diffusion region 122 and drain diffusion regions 121 of a transistor constituting a memory cell are formed on both sides of the word lines in each transistor region. Portions of the word lines located above each transistor region constitute gates of the transistor, and are located on the surface region of the substrate 101 via gate insulating films 102a. The surfaces of the diffusion regions 121 and 122 and the word lines are covered with the first and second interlayer insulating films 103 and 104.

The source diffusion region 122 located between the pair of word lines at each transistor region is connected to a bit line (in FIG. 10, only bit lines 113b₁, 113b₂ and 113b₃ are shown) extending along the second direction perpendicular to the first direction D1, through a contact hole 105b formed in the first and second interlayer insulating films 103 and 104. The drain diffusion regions 121 located outside the pair of word lines at each transistor region are electrically connected to the upper electrodes of the ferroelectric capacitors corresponding to each transistor region by connecting wirings 113a. That is, one end of the connecting wiring 113a is connected to the upper electrode through a contact hole 104a formed in the second interlayer insulating film 104. The other end of the connecting wiring 113a is connected to the drain diffusion region 121 through a contact hole 105a formed in the first and second interlayer insulating films 103 and 104.

In this case, the first interlayer insulating film 103 comprises an insulating material, such as NSG (oxide silicon based) and BPSG (boron, phosphine doped oxide silicon), and the second interlayer insulating film 104 comprises an insulating material, for example, PSG (phosphine doped oxide silicon).

As a ferroelectric material of the ferroelectric layer 113 of the ferroelectric capacitors, KNO₃, PbLa₂O₃—ZrO₂TiO₂, PCTiO₃—PbZrO₃ or the like has been known. In addition, PCT International Publication WO 93/12542 discloses a ferroelectric material that has extremely low fatigueness as compared with PbTiO₃—PbZrO₃, being suitable for a ferroelectric memory device.

In the memory cell array 100 of the tenth embodiment, the structure of the lower layer wiring according to any of the fifth and sixth embodiments is used for the lower electrodes (cell plate electrodes). More specifically, each of the lower electrodes 111a and 111b has a structure that is divided into a plurality of electrode parts (in FIG. 10, only wiring parts 111a₁, 111₂, 111b₁ and 111b₂ are shown), and a plan shape of each electrode part is a zigzag shape. Further, the adjacent electrode parts of the lower electrode are electrically connected through a connecting wiring 113c of a U-shaped plan that is formed by patterning an aluminum layer formed on the interlayer insulating film 104. That is, this connecting wiring 113c is connected to the corresponding electrode parts of the lower electrode, through contact holes 104b that are formed in the interlayer insulating film 104.

Both end portions of each lower electrode, concretely, both end portions 111a₁₁ and 111a₂₂ of the lower electrode 111a shown in FIG. 10 are connected to upper layer wirings 106a₁ and 106a₂ that are formed by patterning an aluminum layer, through contact holes 104c that are formed in the interlayer insulating films 104, respectively, and both end portions 111b₁₁ and 111b₂₂ of the lower electrode 111b are connected to upper layer wirings 106b₁ and 106b₂ that are formed by patterning an aluminum layer, through contact holes 104c that are formed in the interlayer insulating films 104, respectively.

Further, the ferroelectric memory device according to the tenth embodiment is constituted so that the device performs a memory operation of a 1T1C construction, i.e., the device stores information of 1 bit in one memory cell comprising one transistor and one capacitor.

The connecting wirings 113a and 113c and the upper layer wirings 106a₁, 106a₂, 106b₁ and 106b₂ may be formed by patterning the identical aluminum layer, and the connecting wirings and the upper layer wirings may be formed by patterning different aluminum layers.

A brief description is given of the operation of the ferroelectric memory device using this memory cell array construction, with reference to FIG. 12(*a*).

Initially, the word line 123b is selected at time t1, and the lower electrode (cell plate line) 111a of the ferroelectric capacitor is driven at time t2 to make the voltage level of the lower electrode the level corresponding to the logical voltage "H". Thereby, data of the memory cell capacitor (ferroelectric capacitor) 110a₁ is read out onto the bit line 113b₁. At this time, a reference voltage is read out onto the bit line 113b₂.

Then, the voltage level of the cell plate line 111a is changed to the level corresponding to the logical voltage "L" at time t3. At time t4, the word line 123b is made in the unselected state, thereby completing the operation of reading out.

Similarly, the word line 123c is selected at time t5, and the cell plate line 111a is driven at time t6 to make its voltage level the level corresponding to the logical voltage "H". Thereby, data of the memory cell capacitor 110₂ is read out onto the bit line 113b₂. At this time, a reference voltage is read out onto the bit line 113b₁. Then, the voltage level of the cell plate line 111a is changed to the level corresponding to the logical voltage "L" at time t7. At time t8, the word line 123c is made in the unselected state, thereby completing the operation of reading out. The memory operation of a 1T1C construction is performed as described above.

In the ferroelectric memory device with such a construction, the lower electrodes (cell plate lines) 111a and 111b have structures that are respectively divided into a plurality of electrode parts 111a₁, 111a₂, 111b₁ and 111b₂, and a plan shape of each electrode part is a zigzag shape. Therefore, it is possible to disperse the thermal stresses into the respective electrode parts, and reduce the thermal stresses generated in the electrode parts at bent portions of the zigzag plan shapes. Consequently, the thermal stresses of the lower electrodes that affect the ferroelectric layers on the lower electrodes are reduced, and the thermal stresses generated in the ferroelectric layer itself are reduced, thereby suppressing variations in the characteristics and deterioration of the characteristics of the ferroelectric capacitors.

In addition, since the thermal stresses of the lower electrodes that affect the upper layer wirings $106a_1$, $106a_2$, $106b_1$ and $106b_2$ respectively connected to the both end portions of the lower electrodes $111a$ and $111b$ are reduced, production of breaking of the upper layer wirings and breaking of the connection portions of the upper layer wirings and the lower electrodes can be suppressed.

As a result, a ferroelectric memory device having good characteristics and high reliability can be obtained.

Further, in the tenth embodiment, the wiring portions of the lower electrodes have a zigzag shape. Therefore, the upper electrodes constituting the ferroelectric capacitors can be easily arranged in a zigzag shape, whereby it is easy to perform such as the process for securing electrical separation regions between the adjacent upper electrodes.

Furthermore, in the tenth embodiment, although there is described the device that performs a memory operation of a 1T1C construction, the memory operation is not always of this construction. For example, a memory operation of a 2T2C (two transistors and two capacitors) construction may be performed.

FIG. 12(b) is a diagram for explaining a ferroelectric memory device with a 2T2C (two transistors and two capacitors) construction as a modification example of the tenth embodiment, which illustrates a timing chart of a memory operation of a 2T2C (two transistors and two capacitors) construction.

A brief description is given of this operation using FIGS. 12(b) and 10. At time t1, the word lines $123b$ and $123c$ are selected simultaneously, and the cell plate line (lower electrode) $111a$ of the ferroelectric capacitor is driven at time t2 to make its voltage level the level corresponding to the logical voltage "H". Thereby, data of the memory cell capacitor $110a_1$ is read out onto the bit line $113b_1$, and data of the memory cell capacitor $110a_2$ is read out onto the bit line $113b_2$. The complementary data read out from the both memory cell capacitors is amplified by sense amplifiers, thereby reading out data of 1 bit.

Thereafter, the voltage level of the cell plate line $111a$ is changed to the level corresponding to the logical voltage "L" at time t3. At time t4, the word lines $123b$ and $123c$ are made in the unselected state, thereby completing the operation of reading out. Similarly, the above operation is performed at times t5 to t8, thereby reading out data of the memory cell as in the case described above.

As described above, in the ferroelectric memory device having the memory cell array in which the influences by the thermal stresses of the lower electrodes are reduced, by simultaneously selecting two word lines $123b$ and $123c$, the memory operation of a 2T2C construction can be performed.

In the embodiments of the invention, concerning the lower layer wirings or the lower electrodes each comprising a material having large contraction stresses, such as platinum, there are described constructions for reducing the thermal stresses that affect the wirings connected to the lower layer wirings or lower electrodes and the ferroelectric layers formed thereon. However, these constructions are applicable to wirings or electrodes to which not contraction stresses but expansion stresses are applied.

INDUSTRIAL AVAILABILITY

According to a semiconductor device of claim 1, the semiconductor device includes a first wiring extending along a first direction, where stresses are generated inside, and second wirings connected to the first wiring, and end portions of the second wirings connected to the first wiring are bent parallel to a second direction that forms a predetermined angle with respect to the first direction. Therefore, the end portions of the second wirings can be easily transformed by the thermal stresses in the first direction that are generated in the first wiring, thereby effectively reducing the thermal stresses. Consequently, breaking of connection portions of the first and second wirings and breaking of the second wirings due to the thermal stresses being generated in the first wiring can be suppressed, resulting in improved reliability of the semiconductor device.

According to a semiconductor device of claim 2, in the semiconductor device of claim 1, the end portions of the second wirings are bent parallel to a second direction perpendicular to the first direction. Therefore, the end portions of the second wirings can be most easily transformed by the thermal stresses in the first direction, thereby further suppressing production of breaking of the wirings and the like due to the thermal stresses.

According to a semiconductor device of claim 3, the semiconductor device includes a first wiring extending along a first direction, where stresses are generated inside, and second wirings connected to the first wiring, and end portions of the second wirings connected to the first wiring are disposed to extend along the first direction and toward the inside of the first wiring. Therefore, the tensile stresses generated in the first wiring act as compressive force to the end portions of the second wirings, thereby avoiding breaking at the end portions of the second wirings. Further, in this case, the second wirings are arranged so that the second wirings are led to the upper side or lower side of the first wiring, and the bodies of the second wirings form a predetermined angle with respect to the end portions. Accordingly, the bodies can be easily transformed by the stresses in the first direction, thereby effectively reducing the stresses. Consequently, breaking of connection portions of the first and second wirings and breaking of the second wirings due to the stresses being generated in the first wiring can be suppressed, resulting in improved reliability of the semiconductor device.

According to a semiconductor device of claim 4, the semiconductor device includes a first wiring where stresses are generated inside, and second wirings connected to the first wiring, and the first wiring has at least a bent portion at its portion. Therefore, the stresses generated in the first wiring are dispersed into two directions at the bent portion, and due to presence of the bent portion, the first wiring can be easily transformed by the stresses. Consequently, production of breaking of the second wirings and the like due to the stresses in the first wiring can be suppressed, resulting in improved reliability of the semiconductor device.

Further, it is possible to arrange the second wirings connected to the first wiring, parallel to the first wiring. Accordingly, in a wiring layout in which a plurality of wirings are arranged in parallel, the area of a region on a substrate that is occupied by the wirings can be effectively reduced.

According to a semiconductor device of claim 5, in the semiconductor device of claim 4, the first wiring has a zigzag plan shape and is bent at a plurality of positions. Therefore, the reduction by variation of the stresses generated in the first wiring is performed further effectively, whereby the influences by the stresses of the first wiring on the second wirings can be further reduced.

According to a semiconductor device of claim 6, in the semiconductor device of claim 5, sides of the bent portions of the first wiring are parallel to directions, except a direction perpendicular to a first direction. Therefore, the size of the first wiring having a zigzag plan shape in the direction perpendicular to the first direction is reduced, thereby reducing a region on a substrate that is occupied by the first wiring.

According to a semiconductor device of claim 7, the semiconductor device includes a first wiring where stresses are generated inside, and second wirings connected to the first wiring, the whole of the first wiring is divided into a plurality of wiring parts, and the respective wiring parts are electrically connected to form a predetermined current path extending from one end of the first wiring to the other end. Therefore, the stresses generated in the first wiring are dispersed into the respective wiring parts, thereby reducing the stresses in the first wiring. Consequently, production of breaking of the second wirings and the like due to the stresses in the first wiring can be suppressed, resulting in improved reliability of the semiconductor device.

According to a semiconductor device of claim 8, the semiconductor device includes a first wiring extending along a first direction, where stresses are generated inside, and second wirings connected to the first wiring, and the first wiring has narrow wiring width portions with narrower wiring widths than those of the other portions, at its portions. Therefore, the first wiring can be more easily transformed by the stresses in the first direction at the narrow wiring width portions than at the other portions, thereby effectively reducing the stresses. Consequently, breaking of connection portions of the first and second wirings and breaking of the second wirings due to the stresses being generated in the first wiring can be suppressed, resulting in improved reliability of the semiconductor device.

Further, it is possible to arrange the second wirings connected to the first wiring, parallel to the first wiring. Accordingly, in a wiring layout in which a plurality of wirings are arranged in parallel, the area of a region on a substrate that is occupied by the wirings can be effectively reduced.

According to a semiconductor device of claim 9, in the semiconductor device of claim 8, the narrow wiring width portions are formed by chipping a body of the first wiring from both sides at predetermined positions in the wiring path. Therefore, the narrow wiring width portions are positively transformed by the stresses being generated in the first wiring, thereby suppressing transformation of the portions of the first wiring, except the narrow wiring width portions.

According to a semiconductor device of claim 10, in the semiconductor device of claim 9, sides of the narrow wiring width portions of the first wiring are parallel to directions, except a direction perpendicular to the first direction. Therefore, the areas of chipped parts are reduced, thereby securing wide regions between the adjacent narrow wiring width portions. For example, when element composing materials, such as capacitors, are disposed at the regions between the adjacent narrow wiring width portions, large-capacity capacitors can be realized.

According to a semiconductor device of claim 11, in the semiconductor device of claim 8, a body of the first wiring has at least a first narrow wiring width portion that is formed by chipping one side of the body, and at least a second narrow wiring width portion that is formed by chipping the other side of the body. Therefore, when the narrow wiring width portions are transformed by the stresses being generated in the first wiring, the narrow wiring width portions curve so that chipped parts warp backward, thereby exceedingly reducing the stresses by the transformation of the narrow wiring width portions. Consequently, breaking of the second wirings and the like due to the stresses in the first wiring can be further suppressed, resulting in further improved reliability of the semiconductor device.

According to a semiconductor device of claim 12, in the semiconductor device of claim 11, the wiring widths of the first and second narrow wiring width portions of the first wiring are larger than ½ of those of the portions of the first wiring body, except the narrow wiring width portions, and the center line of the first wiring is divided into parts by the chipped parts at the first and second narrow wiring width portions. Therefore, in the narrow wiring width portions that are formed by chipping, transformation easily occurs by curving due to the stresses of the first wiring. That is, the narrow wiring width portions can be easily transformed. Consequently, breaking of the second wirings and the like due to the stresses in the first wiring can be further suppressed, resulting in exceedingly improved reliability of the semiconductor device.

According to a semiconductor device of claim 13, in the semiconductor device of claim 12, sides of the narrow wiring width portions of the first wiring at the chipped part sides are parallel to directions, except a direction perpendicular to the first direction. Therefore, the areas of chipped parts are reduced, thereby securing wide regions between the adjacent narrow wiring width portions in the first wiring. For example, when element composing materials, such as capacitors, are disposed at the regions between the adjacent narrow wiring width portions, large-capacity capacitors can be realized.

According to a semiconductor device of claim 14, the semiconductor device includes a first wiring extending along a first direction, where stresses are generated inside, and second wirings connected to the first wiring, and the first wiring has at least a through opening in its portion. Therefore, the portion of the first wiring in which the through opening is formed can be more easily transformed by the stresses in the first direction than the other portions, thereby effectively reducing the stresses. Consequently, breaking of connection portions of the first and second wirings and breaking of the second wirings due to the stresses being generated in the first wiring can be suppressed, resulting in improved reliability of the semiconductor device.

According to a semiconductor device of claim 15, in the semiconductor device of claim 14, the plan shape of the through opening is a rectangular shape in which the length in the first direction is smaller than the length in a direction perpendicular to the first direction. Therefore, the portion of the first wiring in which the through opening is formed can be more easily transformed. Consequently, breaking of the second wirings and the like due to the stresses in the first wiring can be further suppressed, resulting in exceedingly improved reliability of the semiconductor device.

According to a semiconductor device of claim 16, in the semiconductor device of any of claims 1 to 15, the first wiring comprises platinum, iridium, or tungsten, and an insulating layer comprising a ferroelectric material is formed on the surface of the first wiring. Therefore, even when the first wiring comprises a metallic material having a larger thermal expansion coefficient, breaking of the second wirings and breaking of connection portions of the first and second wirings due to the thermal stresses being generated in the first wiring can be suppressed. Further, when the insulating layer that is formed on the surface of the first wiring is used as a dielectric layer of a ferroelectric capacitor constituting a ferroelectric memory device, variations in characteristics and characteristic deterioration of the ferroelectric capacitors due to the stresses in the first wiring, i.e., variations in polarizability of the ferroelectric layer and a reduction in polarizability accompanying the use, can be suppressed.

According to a semiconductor device of claim 17, a first electrode of ferroelectric capacitors constituting a ferroelectric memory device has at least a bent portion at its portion. Therefore, stresses generated in the first electrode are dispersed into two directions at the bent portion, and the first electrode can be easily transformed by the stresses, due to presence of the bent portion. Consequently, stresses in a ferroelectric layer that is formed closely to the first electrode are reduced, thereby suppressing variations in characteristics and characteristic deterioration of the ferroelectric capacitors. Further, the influences by the thermal stresses of the first electrode on wirings that are connected to the first electrode constituted as a cell plate line are reduced, thereby suppressing production of breaking of the wirings and the like, resulting in improved reliability of the ferroelectric memory device.

According to a semiconductor device of claim 18, the whole of a first electrode of ferroelectric capacitors constituting a ferroelectric memory device is divided into a plurality of electrode parts, and the respective electrode parts are electrically connected to form a predetermined current path extending from one end of the first electrode to the other end. Therefore, stresses, such as thermal stresses, which are generated in the first electrode are dispersed into the respective electrode parts, thereby reducing the stresses in the first electrode. Consequently, as in claim 17, variations in characteristics and characteristic deterioration of the ferroelectric capacitors can be suppressed, and production of breaking of wirings that are connected to the first electrode and the like can be suppressed, resulting in improved reliability of the ferroelectric memory device.

According to a semiconductor device of claim 19, in the semiconductor device of claim 17, the first electrode has a zigzag plan shape and is bent at a plurality of positions. Therefore, the reduction by variation of the stresses generated in the first electrode is performed further effectively, whereby the influences by the stresses of the first electrode on the wirings connected to the first electrode can be further reduced.

According to a semiconductor device of claim 20, in the semiconductor device of claim 19, first and second word line groups corresponding to first and second memory cell groups, and first and second bit line groups corresponding to the first and second memory cell groups are provided, and a word line of the first word line group and a word line of the second word line group are simultaneously selected to read out complementary data onto bit lines of the first and second bit line groups. Therefore, reading out of wrong data due to variations in characteristics and changes in characteristics of ferroelectric capacitors can be suppressed. As a result, a ferroelectric memory device, in which changes in characteristics, such as variations in the characteristics and characteristic deterioration, of ferroelectric capacitors are less and a 2T2C complementary type operation is stable, can be obtained.

We claim:

1. A semiconductor device including:
   a first wiring extending along a first direction and having a wiring width direction in a second direction perpendicular to the first direction, where stresses are generated inside; and
   second wirings which are situated above the first wiring, connected to the first wiring through a contact hole, and affected by the stresses of the first wiring;
   said second wirings including end portions which are connected to the first wiring, said end portions of said second wirings being bent in a direction which is parallel to a direction that forms a predetermined angle with respect to the first direction and on a plane including the first direction and the second direction.

2. The semiconductor device as defined in claim 1, wherein;
   the end portions of the second wirings connected to the first wiring are bent parallel to the second direction perpendicular to the first direction.

3. The semiconductor device as defined in claim 1, wherein the first wiring comprises at least one member selected from the group consisting of platinum, iridium, titanium and tungsten.

4. The semiconductor device as defined in claim 1, further comprising an insulating layer formed on the surface of the first wiring, said insulating layer comprising a ferroelectric material.

5. A semiconductor device including:
   a first wiring extending along a first direction and having a wiring width direction and a second direction perpendicular to the first direction, where stresses are generated inside; and
   second wirings which are situated above the first wiring, connected to end portions of the first wiring through a contact hole, and affected by the stresses of the first wiring;
   wherein the second wirings include end portions which are bent with respect to the remainder of the second wirings, said end portions being on a plane which is parallel to a plane defined by said first wiring and includes the first direction and the second direction, wherein tip parts of the end portions of the second wirings are connected to the first wiring and are disposed to extend along the first wiring and toward the inside of the first wiring.

6. The semiconductor device as defined in claim 5, wherein the first wiring comprises at least one member selected from the group consisting of platinum, iridium, titanium and tungsten.

7. The semiconductor device as defined in claim 5, further comprising an insulating layer formed on the surface of the first wiring, said insulating layer comprising a ferroelectric material.

8. A semiconductor device including:
   a first wiring extending along a first direction and having a wiring width which is planarly perpendicular to the first direction; and
   second wirings which are situated above the first wiring, connected to the first wiring through a contact hole and affected by the stresses of the first wiring;
   wherein the first wiring has a bent portion formed at a portion of the first wiring; and
   the second wirings having end portions connected to the first wiring, said end portions being bent parallel to a direction that forms a predetermined angle with respect to the first direction on a plane including the first direction and the second direction.

9. The semiconductor device as defined in claim 8, wherein;

a body of the first wiring, except end portions that are connected to the second wirings, is bent at a plurality of positions to have a zigzag plan shape.

10. The semiconductor device as defined in claim 9, wherein;
the first wiring body comprises only oblique wiring parts parallel to directions, except a direction perpendicular to a first direction, or only the oblique wiring parts and wiring parts parallel to the first direction.

11. The semiconductor device as defined in claim 8, wherein the first wiring comprises at least one member selected from the group consisting of platinum, iridium, titanium and tungsten.

12. The semiconductor device as defined in claim 8, further comprising an insulating layer formed on the surface of the first wiring, said insulating layer comprising a ferroelectric material.

13. A semiconductor device including:
a first wiring extending along a first direction and having a wiring width direction in a second direction perpendicular to the first direction, where stresses are generated inside; and
second wirings which are situated above the first wiring, connected to the first wiring through a contact hole, and affected by the stresses of the first wiring
wherein the whole of the first wiring is divided into a plurality of wiring parts; and
the respective wiring parts of the first wiring are electrically connected by the second wirings to form a predetermined current path extending from one end of the first wiring to the other end, the respective wiring parts of the first wiring having wiring lengths, each wiring length being not more than twenty times that of a corresponding wiring width.

14. A ferroelectric memory device having a plurality of ferroelectric capacitors, said device including:
a first wiring, which extends along a first direction and having a wiring width direction in a second direction perpendicular to the first direction, where stresses are generated inside; and
second wirings, which are electrically connected to the first wiring and are affected by the stresses of the first wiring, said first wiring and said second wirings constituting the ferroelectric capacitors,
wherein the first wiring has narrow wiring width portions formed by chipping portions of a first wiring body, with the exception of end portions that are connected to the second wirings, the wiring width of each of the narrow wiring width portions being narrower than that of remaining wiring width portions except the end portions, and the length of the narrow wiring width portions being shorter than that of the remaining wiring width portions.

15. The semiconductor device as defined in claim 14, wherein;
the narrow wiring width portions are formed by chipping the first wiring body from the both sides at predetermined positions in the wiring path.

16. The semiconductor device as defined in claim 15, wherein;
sides of the narrow wiring width portions are parallel to directions, except a direction perpendicular to the first direction.

17. The semiconductor device as defined in claim 14, wherein;
the first wiring body has at least a first narrow wiring width portion that is formed by chipping the body from one side, and at least a second narrow wiring width portion that is formed by chipping the body from the other side.

18. The semiconductor device as defined in claim 17, wherein;
the wiring widths of the first and second narrow wiring width portions are smaller than ½ of those of the portions of the first wiring body, except the narrow wiring width portions, and the current path along the center line of the first wiring is divided by the chipped parts at the first and second narrow wiring width portions.

19. The semiconductor device as defined in claim 17, wherein;
sides of the first and second narrow wiring width portions at the chipped part sides are parallel to directions, except a direction perpendicular to the first direction.

20. The semiconductor device as defined in claim 8, wherein the first wiring comprises at least one member selected from the group consisting of platinum, iridium, titanium and tungsten.

21. The semiconductor device as defined in claim 8, further comprising an insulating layer formed on the surface of the first wiring, said insulating layer comprising a ferroelectric material.

22. A ferroelectric memory device having ferroelectric capacitors including:
a first wiring which extends along a first direction and having a wiring width direction in a second direction perpendicular to the first direction, where stresses are generated inside; and
second wirings which are situated above the first wiring, connected to the first wiring through a contact hole, and affected by the stresses of the first wiring, said first wiring and said second wirings constituting ferroelectric capacitors,
said first wiring having through openings that are formed in a first wiring body, said body including end portions which are connected to the second wirings.

23. The semiconductor device as defined in claim 22, wherein;
the plan shapes of the through openings are made a rectangular shape in which the length in the first direction is smaller than the length in the second direction perpendicular to the first direction.

24. The semiconductor device as defined in claim 14, wherein the first wiring comprises at least one member selected from the group consisting of platinum, iridium, titanium and tungsten.

25. The semiconductor device as defined in claim 14, further comprising an insulating layer formed on the surface of the first wiring, said insulating layer comprising a ferroelectric material.

26. A semiconductor device constituting a ferroelectric memory device with a plurality of memory cells comprising transistors and ferroelectric capacitors, wherein:
the ferroelectric capacitor comprises a first electrode where stresses are generated inside, a second electrode positioned opposite to this first electrode, and a ferroelectric layer positioned between the first and second electrodes;
the first electrode having a bent portion formed at its portion.

27. The semiconductor device as defined in claim 26, wherein;

a body of the first electrode, except both end portions, is bent at a plurality of positions to have a zigzag plan shape.

28. The semiconductor device as defined in claim 19, including:
- first and second memory cell groups each comprising a plurality of memory cells;
- first and second bit line groups corresponding to the first and second memory cell groups;
- first and second word line groups provided corresponding to the first and second memory cell groups, and comprising a plurality of word lines for controlling ON and OFF of transistors constituting the memory cells of the corresponding memory cell groups; and
- sense amplifiers connected to the respective bit lines of the first and second bit line groups, for sensing storage data on the bit lines, wherein:
- the first electrode of the ferroelectric capacitor constituting each memory cell is connected to a cell plate line for applying a predetermined driving voltage to the electrode;
- the second electrode of the ferroelectric capacitor constituting each memory cell of the first memory cell group is connected to the corresponding bit line of the first bit line group through the transistor of the first memory cell group;
- the second electrode of the ferroelectric capacitor constituting each memory cell of the second memory cell group is connected to the corresponding bit line of the second bit line group through the transistor of the second memory cell group; and
- the word line of the first word line group and the word line of the second word line group are simultaneously selected so that complementary data is read out onto the corresponding bit lines of both of the bit line groups.

29. A semiconductor device constituting a ferroelectric memory device with a plurality of memory cells comprising transistors and ferroelectric capacitors, wherein:
- the ferroelectric capacitor comprises a first electrode that extends along a first direction, where stresses are generated inside, a second electrode positioned opposite to this first electrode, and a ferroelectric layer positioned between the first and second electrodes;
- the whole of the first electrode being divided into a plurality of electrode parts, and the respective electrode parts being electrically connected to form a predetermined current path extending from one end of the first electrode to the other end.

* * * * *